United States Patent
Yee et al.

(10) Patent No.: US 10,932,384 B2
(45) Date of Patent: Feb. 23, 2021

(54) COVER WINDOW AND DISPLAY APPARATUS HAVING THE SAME

(71) Applicant: Samsung Display Co. Ltd., Yongin-si (KR)

(72) Inventors: Dong Su Yee, Cheonan-si (KR); Min Hyuk Im, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/449,461

(22) Filed: Jun. 24, 2019

(65) Prior Publication Data

US 2020/0093016 A1    Mar. 19, 2020

(30) Foreign Application Priority Data

Sep. 13, 2018    (KR) ........................ 10-2018-0109701

(51) Int. Cl.
| | | |
|---|---|---|
| G06F 1/16 | (2006.01) | |
| H05K 5/03 | (2006.01) | |
| H04R 1/02 | (2006.01) | |
| H05K 5/00 | (2006.01) | |
| H05K 5/02 | (2006.01) | |
| H01L 27/32 | (2006.01) | |
| H01L 51/52 | (2006.01) | |
| H04M 1/02 | (2006.01) | |

(52) U.S. Cl.
CPC ................. *H05K 5/03* (2013.01); *H04R 1/02* (2013.01); *H05K 5/0017* (2013.01); *H05K 5/0217* (2013.01); *H01L 27/3244* (2013.01); *H01L 51/5237* (2013.01); *H04M 1/0266* (2013.01); *H04R 2499/15* (2013.01)

(58) Field of Classification Search
CPC .... G06F 1/1637; G06F 1/1656; G06F 1/1688; H05K 5/03; H05K 5/0017; H04R 1/023; H04R 1/288
USPC ........................... 361/679.3, 679.55, 679.56
See application file for complete search history.

(56) References Cited

U.S. PATENT DOCUMENTS

| | | | |
|---|---|---|---|
| 8,488,817 B2 * | 7/2013 | Mittleman | H04R 1/025 |
| | | | 381/189 |
| 10,015,574 B1 * | 7/2018 | Luce | H04R 1/04 |
| (Continued) | | | |

FOREIGN PATENT DOCUMENTS

KR    10-1237435    2/2013

OTHER PUBLICATIONS

Extended European Search Report dated Jan. 29, 2020, issued in European Patent Application No. 19195011.2.

*Primary Examiner* — Anthony Q Edwards
(74) *Attorney, Agent, or Firm* — H.C. Park & Associates, PLC

(57) ABSTRACT

A cover window is provided. The cover window includes: a transparent base layer which comprises a speaker opening; a first print layer which is disposed on a surface of the transparent base layer; a protective member which is disposed on the first print layer; and a mesh structure which comprises a mesh pattern and a ground part connected to the mesh pattern, wherein the mesh pattern of the mesh structure is inserted into the speaker opening, the ground part of the mesh structure is disposed outside the speaker opening, and the protective member comprises a protective film part disposed between the first print layer and the ground part.

20 Claims, 23 Drawing Sheets

(56) References Cited

U.S. PATENT DOCUMENTS

| | | | |
|---|---|---|---|
| 2007/0290945 A1* | 12/2007 | Gold | H01Q 9/0421 |
| | | | 343/904 |
| 2011/0261513 A1* | 10/2011 | Tho | G02F 1/133308 |
| | | | 361/679.01 |
| 2012/0045081 A1* | 2/2012 | Mittleman | H04R 1/02 |
| | | | 381/334 |
| 2012/0134518 A1* | 5/2012 | Otani | H04R 1/023 |
| | | | 381/189 |
| 2019/0320049 A1* | 10/2019 | Nam | H04M 1/0202 |
| 2019/0349668 A1* | 11/2019 | McClary | H04R 1/288 |

* cited by examiner

COVER WINDOW AND DISPLAY APPARATUS HAVING THE SAME

CROSS REFERENCE TO RELATED APPLICATION

This application claims priority from and the benefit of Korean Patent Application No. 10-2018-0109701, filed on Sep. 13, 2018, which is hereby incorporated by reference for all purposes as if fully set forth herein.

BACKGROUND

Field

Exemplary embodiments/implementations of the invention relate generally to a cover window and a display apparatus having the same.

Discussion of the Background

Recently, various mobile electronic devices employing a liquid crystal display (LCD) or an organic light emitting diode display (OLED) as a display apparatus have been used. Examples of such mobile electronic devices include mobile phones, navigation devices, digital cameras, electronic books, portable game consoles, and various terminals.

In a conventional display apparatus used in such a mobile device, a transparent cover window to allow a user to see a display portion is provided in front of a display panel. The display panel is divided into a display area in which an actual image is displayed and a non-display area surrounding the display area. The cover window s divided into a light transmitting area corresponding to the display area and an opaque light shielding area corresponding to the non-display area.

A mobile device includes many components such as a speaker, a camera, a proximity sensor, physical buttons, an electrostatic button, and/or a microphone, in addition to the display apparatus. These coinpot Wets are located on or behind the light shielding area of the cover window, and various holes are formed in the cover window in order to allow these components to perform their functions. However, these holes can serve as a path through which external static electricity is introduced, and the display apparatus can be damaged by the introduced static electricity.

The above information disclosed in this Background section is only for understanding of the background of the inventive concepts, and, therefore, it may contain information that does not constitute prior art.

SUMMARY

Devices constructed according to exemplary embodiments of the invention provide a cover window including a ground part that can discharge static electricity introduced from the outside and a display apparatus having the cover window.

Exemplary embodiments of the invention also provide a cover window capable of preventing or reducing deformation of a ground part in an assembly process.

Additional features of the inventive concepts will be set forth in the description which follows, and in part will be apparent from the description, or may be learned by practice of the inventive concepts.

According to an aspect of the present disclosure, there is provided a cover window. A cover window includes: a transparent base layer which comprises a speaker opening; a first print layer which is disposed on a surface of the transparent base layer; a protective member which is disposed on the first print layer; and a mesh structure which comprises a mesh pattern and a ground part connected to the mesh pattern, wherein the mesh pattern of the mesh structure is inserted into the speaker opening, the ground part of the mesh structure is disposed outside the speaker opening, and the protective member comprises a protective film part disposed between the first print layer and the ground part.

According to another aspect of the present disclosure, there is provided a display apparatus. A display apparatus includes: a cover window which comprises a speaker opening; a display panel which is disposed below the cover window; and a middle frame which is disposed below the display panel, wherein a mesh structure comprising a mesh pattern and a ground part connected to the mesh pattern is disposed in the speaker opening, and the ground part contacts the middle frame.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
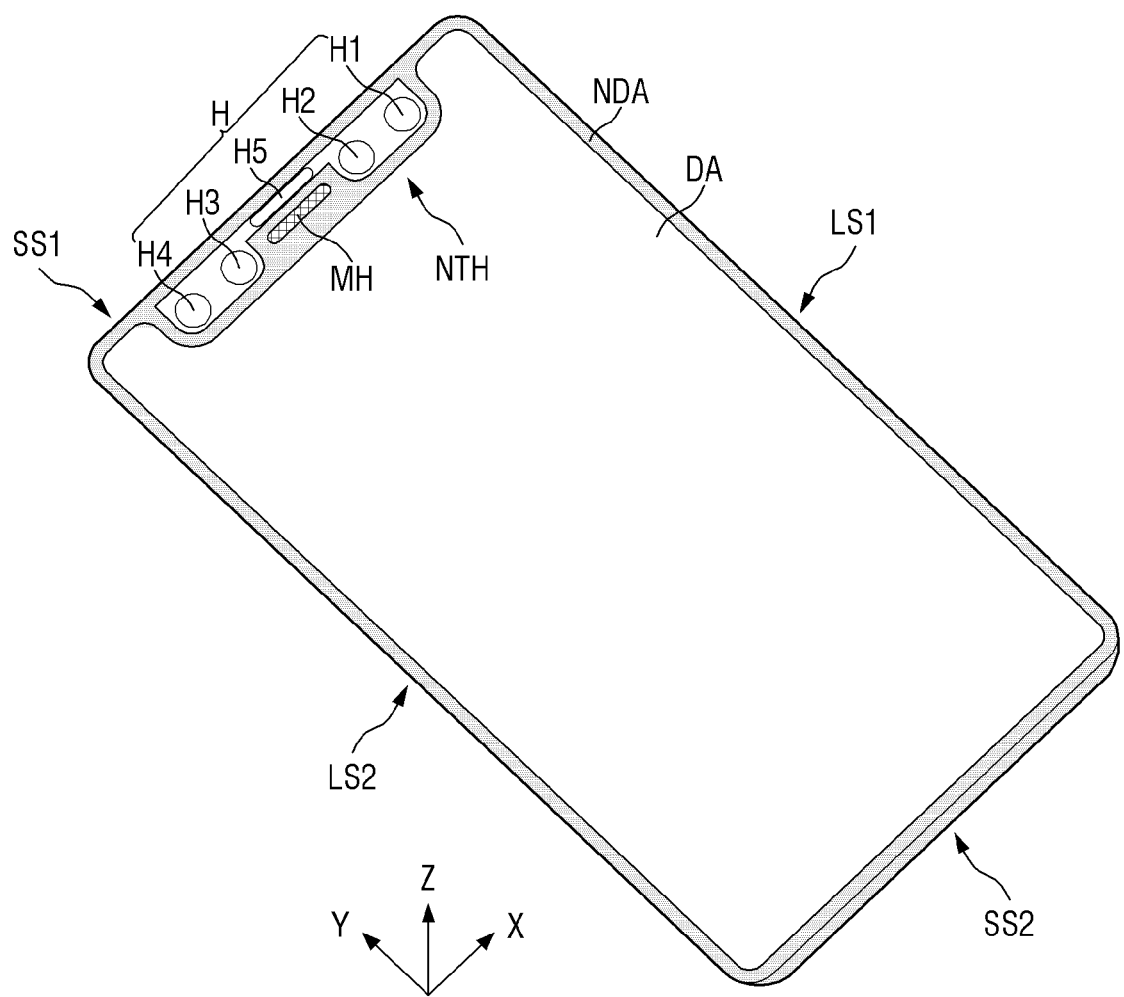
FIG. 1 is a perspective view of a cover window according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of a cover window 100 according to an exemplary embodiment. Referring to FIG. 1, the cover window 100 according to the exemplary embodiment may have a rectangular shape in plan view. For example, the cover window 100 may be shaped like a rectangle with right-angled corners or a rectangle with round corners in plan view. The cover window 100 may include both long sides LS1 and LS2 and both short sides SS1 and SS2. In the rectangular cover window 100, a long side located on a right side in plan view will be referred to as a first long side LS1, a long side located on a left side in plan view will be referred to as a second long side LS2, a short side located on an upper side in plan view will be referred to as a first short side SS1, and a short side located on a lower side in plan view will be referred to as a second short side SS2. The long sides LS1 and LS2 of a display apparatus 10 (see FIG. 22) may be, but are not necessarily, about 1.5 to 2.5 times longer than the short sides SS1 and SS2. In addition, the cover window 100 may have a flat rectangular shape. However, the present disclosure is not limited to this case, and the cover window 100 may also have a shape including a flat portion and a curved surface extending from the flat portion and having a certain curvature or a shape including a curved surface only.

Figure 22:
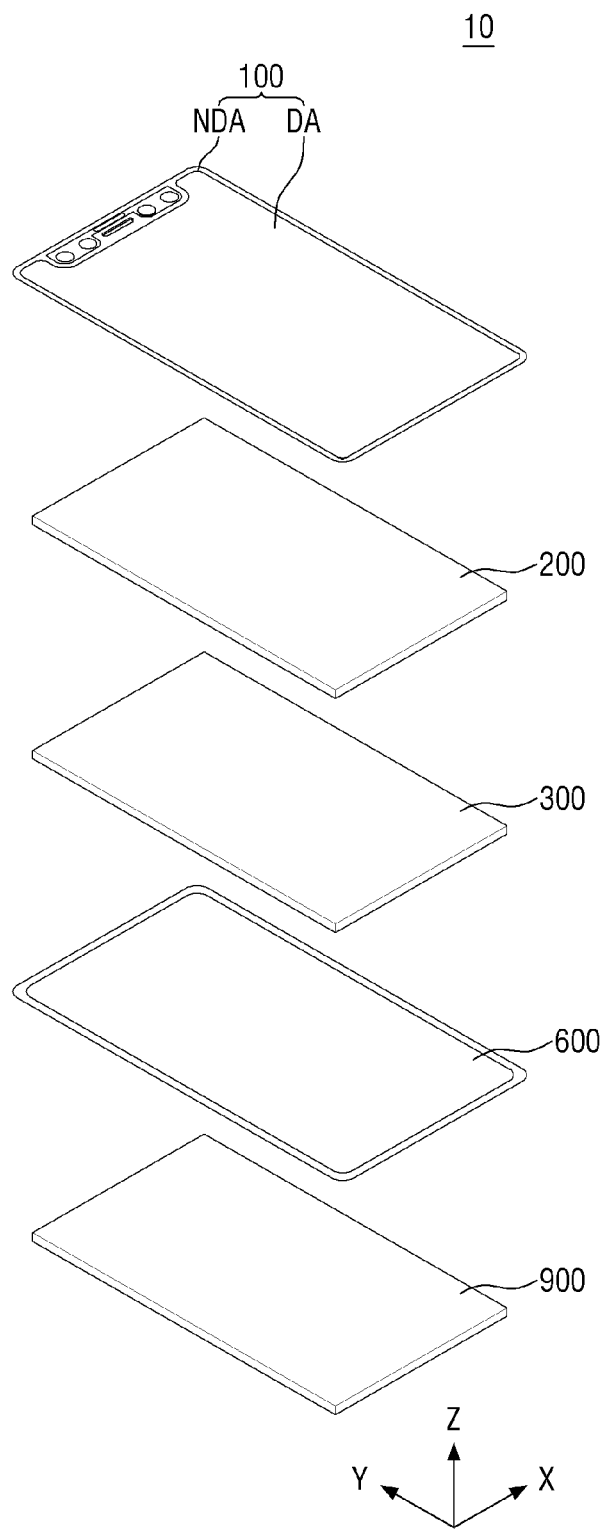
FIG. 22 is an exploded perspective view of a display apparatus including a cover window according to an exemplary embodiment.

The cover window 100 may include a transmissive portion DA corresponding to a display area of a display panel 300 and a light shielding portion NDA corresponding to a non-display area of the display panel 300 and/or an area other than the display panel 300 as illustrated in FIG. 22. The light shielding portion NDA may surround the transmissive portion DA and may include a notch portion NTH. For example, the notch portion NTH recessed into the transmissive portion DA may be disposed on the first short side SS1 of the cover window 100. Alternatively, the notch portion NTH may be disposed on at least one of the first short side SS1, the second short side SS2, the first long side LS1 and the second long side LS2 of the cover window 100.

The light shielding portion NDA may be formed opaque. In an exemplary embodiment, the light shielding portion NDA may be formed as a decorative layer having a pattern that is shown to a user when an image is not displayed. For example, the light shielding portion NDA may be patterned with a company's logo such as "SAMSUNG" or various characters.

A plurality of holes or openings, for example H1, H2, H3, H4, and H5, collectively referred to as holes H, may be provided for exposing a front camera, an infrared sensor, an iris recognition sensor, an ultrasonic sensor, an illuminance sensor, etc. and may be disposed in the light shielding portion NDA. However, the present disclosure is not limited to this case. For example, some or all of the front camera, the infrared sensor, the iris recognition sensor, the ultrasonic sensor, and the illuminance sensor may be embedded in the display panel 300 as illustrated in FIG. 22, in which case some or all of the holes H may be removed. In addition, a speaker hole MH for exposing a front speaker may be disposed in the light shielding portion NDA. In an exemplary embodiment, the holes H and the speaker hole MH may be disposed in the notch portion NTH of the light shielding portion NDA. However, the holes H and the speaker hole MH may also be distributed in the light shielding portion NDA disposed on the second short side SS2, the first long side LS1 and the second long side LS2.

The over window 100 may be made of glass, sapphire, and/or plastic. The cover window 100 may be rigid or flexible.

Figure 2:
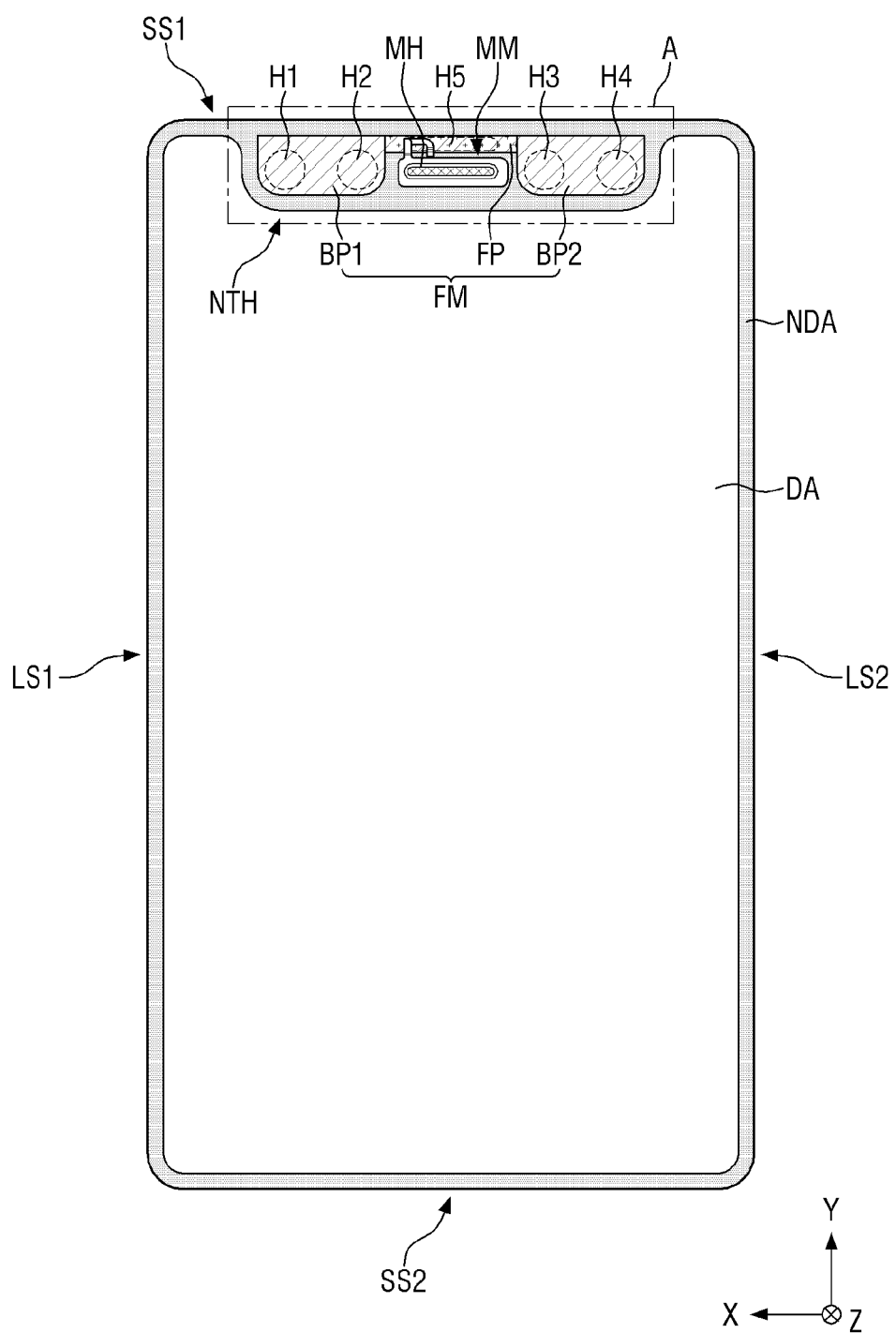
FIG. 2 is a schematic bottom view of the cover window according to the exemplary embodiment.
Figure 3:
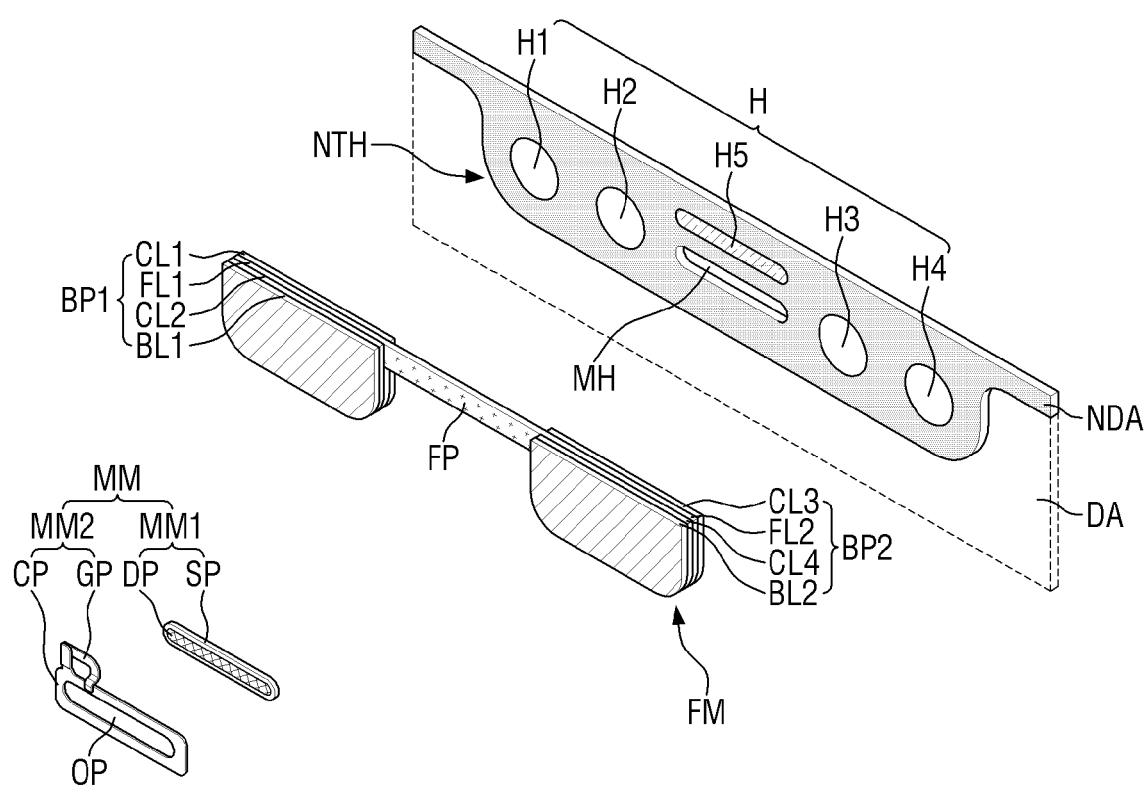
FIG. 3 is an exploded perspective view of a notch portion of the cover window according to the exemplary embodiment.

FIG. 2 is a schematic bottom view of the cover window 100 according to the exemplary embodiment, and FIG. 3 is an exploded perspective view of area A corresponding to the notch portion NTH of the cover window 100 according to the exemplary embodiment.

Referring to FIGS. 2 and 3, the cover window 100 may include first through fifth holes H1 through H5, the speaker hole MH, a protective member FM and a mesh structure MM. The protective member FM and the mesh structure MM may be disposed on a surface of the cover window 100. In the following description, the surface of the cover window 100 on which the protective member FM and the mesh structure MM are disposed will be referred to as a lower surface of the cover window 100, unless otherwise specified.

Figure 6:
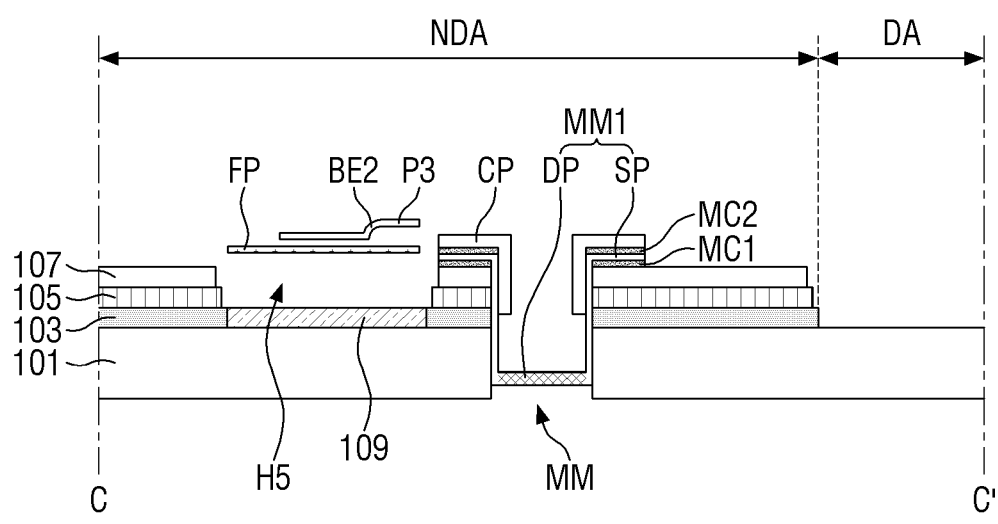
FIG. 6 is a cross-sectional view taken along line C-C' of FIG. 4A.
Figure 7:
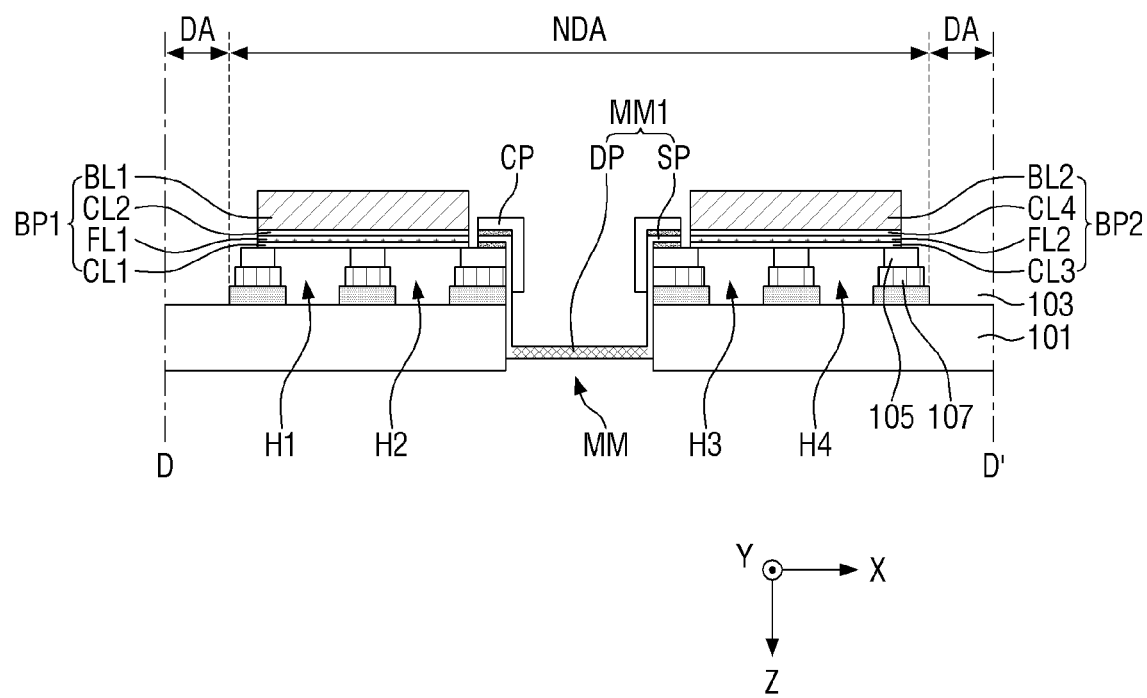
FIG. 7 is a cross-sectional view taken along line D-D' of FIG. 4A.

The first through fifth holes H1 through H5 may be disposed in areas corresponding to the iris recognition sensor, the ultrasonic sensor, the illuminance sensor, the infrared sensor, and the camera, respectively. For example, the first hole H1 may be disposed to correspond to the iris recognition sensor, the second hole H2 may be disposed to correspond to the ultrasonic sensor, the third hole H3 may be disposed to correspond to the camera, the fourth hole H4 may be disposed to correspond to the illuminance sensor, and the fifth hole H5 may be disposed to correspond to the infrared sensor. The first through fifth holes H1 through H5 may be optical holes defined by a print layer 103, 105, 107 and 109 disposed on a transparent base layer 101 as illustrated in FIGS. 6 and 7.

Figure 23:
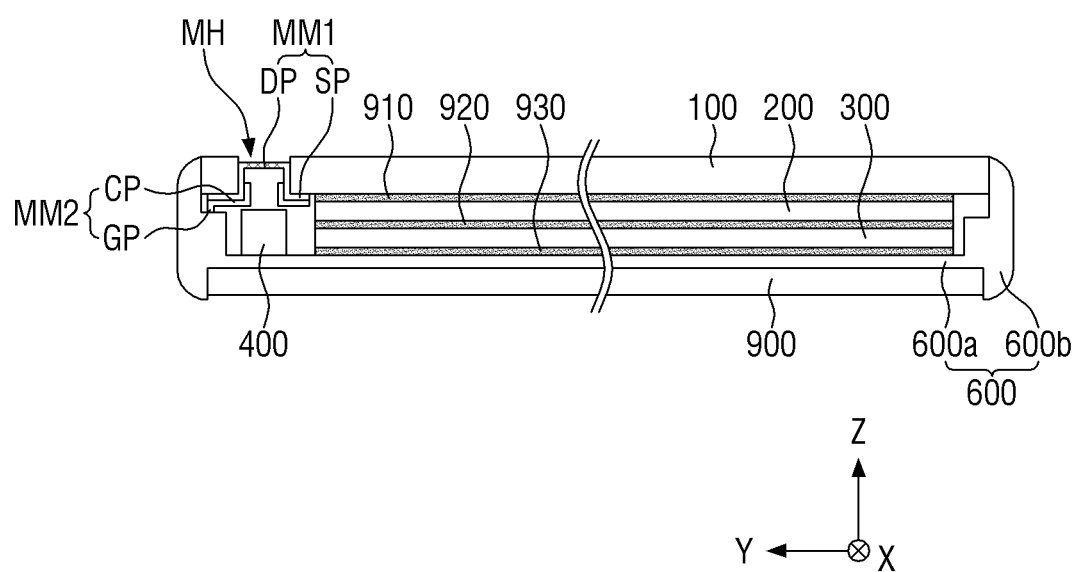
FIG. 23 is a cross-sectional view of the display apparatus including the cover window according to the exemplary embodiment.

The speaker hole MH emits sound produced by a speaker 400 illustrated in FIG. 23 to the outside of the display apparatus 10. Unlike the first through fifth holes H1 through H5, the speaker hole MH (that is, a physical hole) may penetrate the transparent base layer 101 as illustrated in FIG. 7. The mesh structure MM may be assembled in the speaker hole MH.

The protective member FM may include a first mold part BP1, a second mold part BP2, and a protective film part FP disposed between the first mold part BP1 and the second mold part BP2. The first mold part BP1 and the second mold part BP2 are spaced apart from each other in a first direction (X-axis direction), for example, in a horizontal direction. The protective film part FP is disposed in a space between the first mold part BP1 and the second mold part BP2 spaced apart from each other in the horizontal direction.

The first mold part BP1 is disposed on the first hole H1 and the second hole H2, the second mold part BP2 is disposed on the third hole H3 and the fourth hole H4, and the protective film part FP is disposed on the fifth hole H5.

The first mold part BP1 may include a first adhesive layer CL1, a first film layer FL1 on the first adhesive layer CL1, a second adhesive layer CL2 on the first film layer FL1, and a first mold layer BL1 on the second adhesive layer CL2. However, the present disclosure is not limited to this case, and the first mold part BP1 may further include other functional layers or may be composed of only the first adhesive layer CL1 and the first mold layer BL1.

Each of the first adhesive layer CL1 and the second adhesive layer CL2 may be made of a urethane-based material or a silicon-based material. For example, each of the first adhesive layer CL1 and the second adhesive layer CL2 may be made of a urethane-based material, or each of the first adhesive layer CL1 and the second adhesive layer CL2 may be made of a silicon-based material. Alternatively, the first adhesive layer CL1 may be made of a urethane-based material, and the second adhesive layer CL2 may be made of a silicon-based material. Alternatively, the first adhesive layer CL1 may be made of a silicon-based material, and the second adhesive layer CL2 may be made of a urethane-based material. In addition, the first adhesive layer CL1 and the second adhesive layer CL2 may have different adhesive strengths. For example, the adhesive strength of the second adhesive layer CL2 may be greater than the adhesive strength of the first adhesive layer CL1. Alternatively, the adhesive strength of the first adhesive layer CL1 and the adhesive strength of the second adhesive layer CL2 may be the same.

The first film layer FL1 may be disposed between the first adhesive layer CL1 and the second adhesive layer CL2 in a thickness direction. In an exemplary embodiment, the first film layer FL1 may be made of polyethylene terephthalate (PET) resin. However, the first film layer FL1 may also be made of polyester (PE) resin, polystyrene (PS) resin, acrylic resin, polycarbonate (PC) resin, or cyclo olefin polymer (COP).

The first mold layer BL1 may be disposed on the second adhesive layer CL2. The first mold layer BL1 may include, but is not limited to, polycarbonate (PC) resin.

The first mold layer BL1 and the first film layer FL1 may be attached and fixed to each other by the second adhesive layer CL2 and mounted on the first hole H1 and the second hole H2 by the first adhesive layer CL1. The first mold part BP1 including the first adhesive layer CL1, the first film layer FL1, the second adhesive layer CL2 and the first mold layer BL1 stacked sequentially in a third direction (Z-axis direction) may be mounted on the first hole H1 and the second hole H2 in order to prevent or reduce damage and contamination of the first hole H1 and the second hole H2 during assembly or transportation and may protrude on one side of a ground part GP in order to prevent or reduce deformation of the ground part GP.

The first mold part BP1 may be large enough to cover both the first hole H1 and the second hole H2. However, the present disclosure is not limited to this case, and the first mold part BP1 may also be large enough to partially cover the first hole H1 and the second hole H2 or large enough to cover the light shielding portion NDA in addition to the first hole H1 and the second hole H2 in order for secure fixing. Although the first mold part BP1 is illustrated as being quadrilateral in the drawings, this is merely an example, and the first mold part BP1 may also have various shapes as long as it can be mounted on the first hole H1 and the second hole H2.

The first adhesive layer CL1, the first film layer FL1, the second adhesive layer CL2 and the first mold layer BL1 included in the first mold part BP1 may all have the same size. However, the present disclosure is not limited to this case, and some or all of the first adhesive layer CL1, the first film layer FL1, the second adhesive layer CL2 and the first mold layer BL1 may also have different sizes.

The second mold part BP2 may include a third adhesive layer CL3, a second film layer FL2 on the third adhesive layer CL3, a fourth adhesive layer CL4 on the second film layer FL2, and a second mold layer BL2 on the fourth adhesive layer CL4. However, the present disclosure is not limited to this case, and the second mold part BP2 may further include other functional layers, may be composed of only the third adhesive layer CL3 and the second mold layer BL2, or may have a different layer structure from the first mold part BP1.

In an exemplary embodiment, the third adhesive layer CL3 may be disposed on the same layer as the first adhesive layer CL1, and the fourth adhesive layer CL4 may be disposed on the same layer as the second adhesive layer CL2. In addition, each of the third adhesive layer CL3 and the fourth adhesive layer CL4 may be made of a urethane-based material or a silicon-based material. The third adhesive layer CL3 may be made of the same material as the first adhesive layer CL1, and the fourth adhesive layer CL4 may be made of the same material as the second adhesive layer CL2. However, the present disclosure is not limited to this case. The first adhesive layer CL1 and the third adhesive layer CL3 may also be made of different materials, and the second adhesive layer CL2 and the fourth adhesive layer CL4 may also be made of different materials.

The third adhesive layer CL3 and the fourth adhesive layer CL4 may have different adhesive strengths. For example, the adhesive strength of the fourth adhesive layer CL4 may be greater than the adhesive strength of the third adhesive layer CL3. Alternatively, the adhesive strength of the third adhesive layer CL3 and the adhesive strength of the fourth adhesive layer CL4 may be the same. In addition, the adhesive strength of the first adhesive layer CL1 and the adhesive strength of the third adhesive layer CL3 may be the same, and the adhesive strength of the second adhesive layer CL2 and the adhesive strength of the fourth adhesive layer CL4 may be the same.

The second film layer FL2 may be disposed between the third adhesive layer CL3 and the fourth adhesive layer CL4. In an exemplary embodiment, the second film layer FL2 may be disposed on the same layer as the first film layer FL1 and may be made of the same material as the first film layer FL1.

The second mold layer BL2 may be disposed on the fourth adhesive layer CL4. In an exemplary embodiment, the second mold layer BL2 may be made of the same material as the first mold layer BL1.

The second mold layer BL2 and the second film layer FL2 may be attached and fixed to each other by the fourth adhesive layer CL4 and mounted on the third hole H3 and the fourth hole H4 by the third adhesive layer CL3. The second mold part BP2 including the third adhesive layer CL3, the second film layer FL2 on the third adhesive layer CL3, the fourth adhesive layer CL4 on the second film layer FL2 and the second mold layer BL2 on the fourth adhesive layer CL4 may be mounted on the third hole H3 and the fourth hole H4 in order to prevent or reduce damage and contamination of the third hole H3 and the fourth hole H4 during assembly or transportation and may protrude on the other side of the ground part GP in order to prevent or reduce deformation of the ground part GP.

In an exemplary embodiment, the first mold part BP1 and the second mold part BP2 may have the same shape. However, the first mold part BP1 and the second mold part BP2 may also have different shapes depending on the positions and sizes of the holes H and the ground part GP. In addition, in an exemplary embodiment, the first mold part BP1 and the second mold part BP2 may have the same size. However, the first mold part BP1 and the second mold part BP2 may also have different sizes.

The protective film part FP may be disposed between the first mold part BP1 and the second mold part BP2. The protective film part FP may be disposed on the same layer as the first film layer FL1 of the first mold part BP1 and the second film layer FL2 of the second mold part BP2. However, the present disclosure is not limited to this case. Any one of the protective film part FP, the first film layer FL1 and the second film layer FL2 may also be disposed on another layer, or the protective film part FP, the first film layer FL1 and the second film layer FL2 may also be disposed on different layers.

The protective film part FP may be made of polyethylene terephthalate (PET) resin. However, the present disclosure is not limited to this case, and the protective film part FP may also be made of polyester (PE) resin, polystyrene (PS) resin, acrylic resin, polycarbonate (PC) resin, or cyclo olefin polymer (COP). In addition, the protective film part FP, the first film layer FL1, and the second film layer FL2 may be made of the same material, but the present disclosure is not limited to this case.

In an exemplary embodiment, the protective film part FP may be integrally connected to each of the first film layer FL1 and the second film layer FL2. For example, the protective film part FP may have a width smaller than the widths of the first film layer FL1 and the second film layer FL2 and may connect the first film layer FL1 and the second film layer FL2. Alternatively, the protective film part FP may be connected to any one of the first film layer FL1 and the second film layer FL2 and may be separated from the other one.

The protective film part FP may be disposed between the fifth hole H5 and the ground part GP of the mesh structure MM. In an exemplary embodiment, the protective film part FP may be spaced apart from each of the fifth hole H5 and the ground part GP. Since the protective film part FP is connected to the first film layer FL1 and the second film layer FL2, it can be disposed between the fifth hole H5 and the ground part GP without contacting each of the fifth hole H5 and the ground part GP. However, the present disclosure is not limited to this case, and the protective film part FP may also contact a portion of the fifth hole H5 or the ground part GP. The protective film part FP can prevent or reduce the fifth hole H5 from being damaged by the ground part GP during assembly or transportation.

The mesh structure MM may include a first structure MM1 inserted and assembled into the speaker hole MH and a second structure MM2 inserted and assembled into the first structure MM1.

The first structure MM1 may include a mesh pattern part DP disposed inside the speaker hole MH and a support part SP disposed around the speaker hole MH.

The mesh pattern part DP may be shaped like a cylinder with one surface having a mesh pattern and the other surface open. However, the present disclosure is not limited to this case, and the mesh pattern part DP may also have various shapes corresponding to the speaker hole MH. The mesh pattern part DP may be inserted into the speaker hole MH and may emit sound produced by the speaker 400 illustrated in FIG. 23 to the outside of the display apparatus 10.

The support part SP may be formed by bending edges of the other surface of the mesh pattern part DP. The support part SP is disposed around the speaker hole MH to prevent or reduce the mesh pattern part DP from passing through the speaker hole MH.

The second structure MM2 may include a connection part CP assembled to the first structure MM1 and the ground part GP protruding from the connection part CP onto the fifth hole H5. The connection part CP may be shaped like a cylinder (or tube) with one surface and the other surface open and edges of the other surface bent outwards. An open part OP of the connection part CP may be used to assemble to the first structure MM1 and the second structure MM2. The ground part GP may protrude from the connection part CP and be disposed on the fifth hole H5 and the protective film part FP. The ground part GP may be physically connected to the connection part CP. In an exemplary embodiment, the ground part GP and the connection part CP may be integrally formed with each other.

The first mold part BP1, the mesh structure MM and the second mold part BP2 are disposed in the first direction (X-axis direction). Since the first mold part BP1 and the second mold part BP2 protrude further than the mesh structure MM, it is possible to prevent or reduce the mesh structure MM from being damaged or deformed during assembly or transportation. In particular, it is possible to effectively protect the ground part GP of the mesh structure MM which is easily deformed even with a small external force.

Figure 4A:
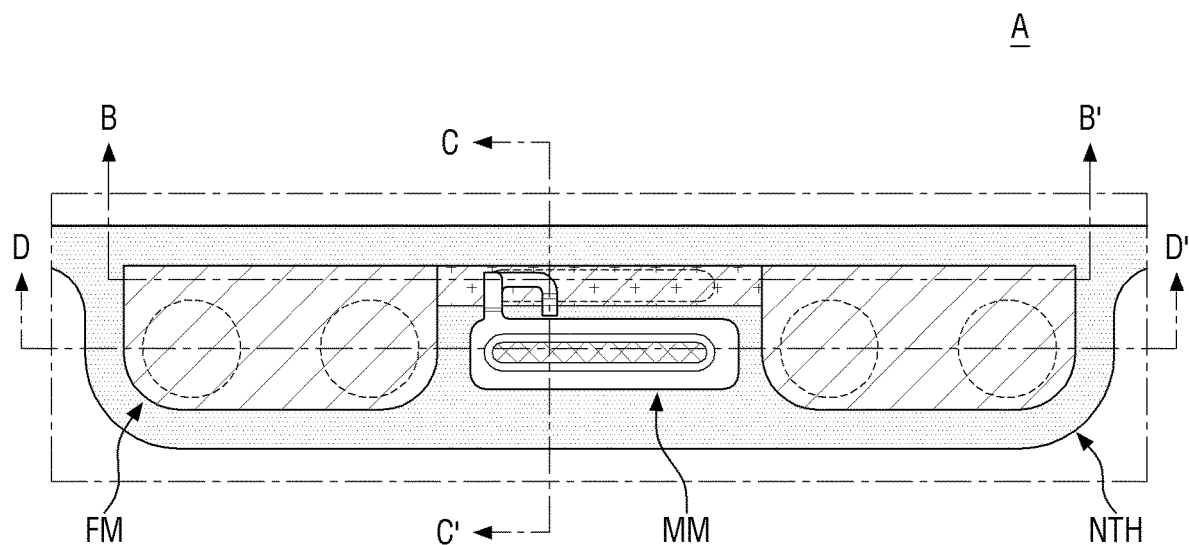
FIG. 4A is an enlarged view of a portion A of FIG. 2.
Figure 4B:
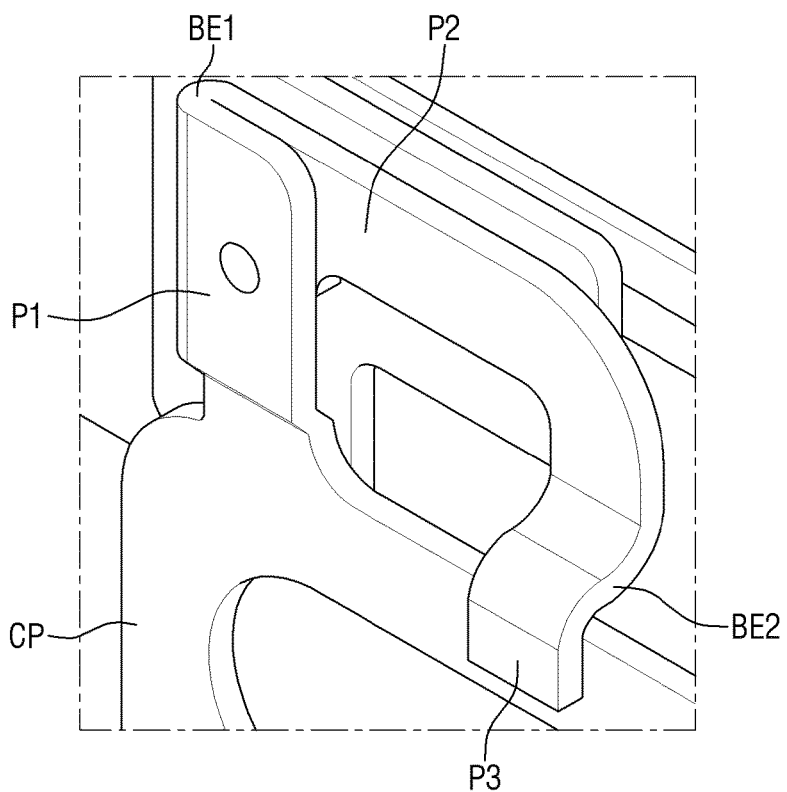
FIG. 4B is an enlarged view of a ground part.

FIG. 4A is an enlarged view of a portion A of FIG. 2, and FIG. 4B is an enlarged view of the ground part GP. Referring to FIG. 4A, the cover window 100 of the exemplary embodiment may include the protective member FM disposed on the first through fifth holes H1 through H5 and the mesh structure MM assembled in the speaker hole MH. The ground part GP of the mesh structure MM is disposed on the protective film part FP of the protective member FM.

The protective member FM may be disposed on the lower surface of the cover window 100 and may be disposed in the notch portion NTH of the light shielding portion NDA. However, the present disclosure is not limited to this case, and the position of the protective member FM may vary according to the positions of the speaker hole MH and the first through fifth holes H1 through H5.

Referring to the ground part GP of the mesh structure MM illustrated in FIG. 4B, the ground part GP of an exemplary embodiment may include a first portion P1 extending from the connection part CP in a second direction (Y-axis direction), a second portion P2 extending from the first portion P1 in an opposite direction to the first direction (X-axis direction), and a third portion P3 extending from the second portion P2 in an opposite direction to the second direction (Y-axis direction).

A first bending portion BE1 is provided at a connecting portion between the first portion P1 and the second portion P2. The first bending portion BE1 is bent from the first portion P1 in the opposite direction to the first direction (X-axis direction). A portion of the first portion P1 and a portion of the second portion P2 may overlap each other due to the first bending portion BE1, and the overlapping portions of the first portion P1 and the second portion P2 may be spaced apart from each other. However, the present disclosure is not limited to this case, and the overlapping portions of the first portion P1 and the second portion P2 may also contact each other. This structure is merely an example, and the first portion P1 and the second portion P2 may also be connected to each other in the same plane without the first bending portion BE1.

The third portion P3 may include a second bending portion BE2 and may be divided into two portions having different heights by the second bending portion BE2. For example, a portion (adjacent to the connection part CP) of the third portion P3 which is located lower than the second bending portion BE2 in the second direction (Y-axis direction) may be located higher than a portion (adjacent to the second portion P2) of the third portion P3 which is located higher than the second bending portion BE2 in the second direction (Y-axis direction).

The first portion P1 of the ground part GP may have a first height, the second portion P2 may have a second height lower than the first height, the portion of the third portion P3 which is located higher than the second bending portion BE2 in the second direction (Y-axis direction) may have a third height equal to the second height, and the portion of the third portion P3 which is located lower than the second bending portion BE2 in the second direction (Y-axis direction) may have a fourth height higher than the third height. In addition, the fourth height may be higher than the first height, and the portion of the third portion P3 which has the fourth height may be spaced apart from the connection part CP. However, the present disclosure is not limited to this case, and the portion of the third portion P3 which has the fourth height may also overlap the connection part CP and contact the connection part CP. That is, the ground part GP of the cover window 100 includes a portion having the fourth height, so that the ground part GP of the cover window 100 of the display apparatus 10 can contact a middle frame 600 as illustrated in FIG. 23. Accordingly, the static electricity introduced through the speaker hole MH of the cover window 100 from the outside can be discharged through the middle frame 600, thereby preventing or reducing damage to components such as a touch sensing device 200 and the display panel 300.

Figure 5:
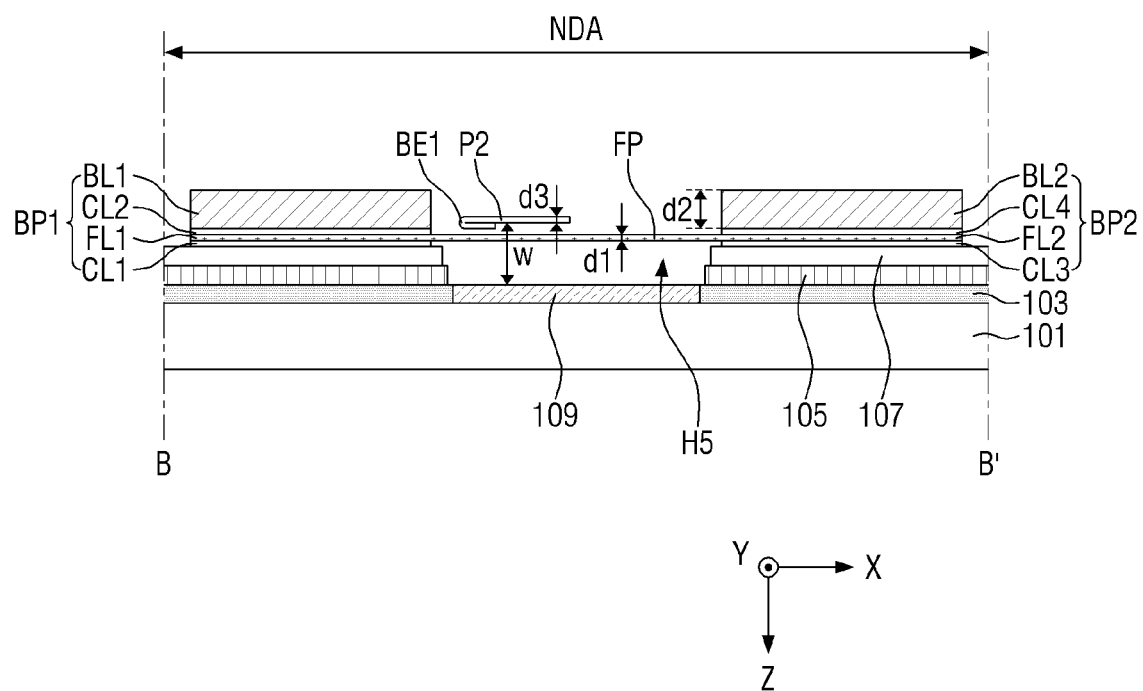
FIG. 5 is a cross-sectional view taken along line B-B' of FIG. 4A.

FIG. 5 is a cross-sectional view taken along line B-B' of FIG. 4A, FIG. 6 is a cross-sectional view taken along line C-C' of FIG. 4A, and FIG. 7 is a cross-sectional view taken along line D-D' of FIG. 4A.

Referring to FIG. 5, the light shielding portion NDA of the cover window 100 of the exemplary embodiment may include the transparent base layer 101 and the print layer 103, 105 and 107 disposed on a surface of the transparent base layer 101. The print layer 103, 105 and 107 hides electrode wiring, etc. of the display panel 300 and is a decorative layer usually called a black matrix.

The transparent base layer 101 may be made of glass, sapphire, plastic, or the like.

The print layer 103, 105 and 107 may be implemented as a stack of a plurality of print layers. For example, the print layer 103, 105 and 107 may include a first print layer 103, a second print layer 105, and a third print layer 107 sequentially disposed on the surface of the transparent base layer 101. The first print layer 103, the second print layer 105 and the third print layer 107 may have different colors. For example, the first print layer 103 may have a black-based color, the second print layer 105 may have a gray-based color, and the third print layer 107 may be transparent. Alternatively, the first print layer 103, the second print layer 105 and the third print layer 107 may be implemented in colors such as white, pearl, silver, gold and pink in order to enhance aesthetic look or to print a logo. In addition, the first print layer 103, the second print layer 105, and the third print layer 107 may have the same thickness, but the present disclosure is not limited to this case.

The first print layer 103, the second print layer 105, and the third print layer 107 may have steps or bends. That is, the first print layer 103, the second print layer 105, and the third print layer 107 may be stacked to have different widths. For example, the width may be gradually reduced toward the first print layer 103, the second print layer 105, and the third print layer 107 sequentially. Alternatively, the first print layer 103, the second print layer 105, and the third print layer 107 may be stacked to have the same width.

The light shielding portion NDA of the cover window 100 may include the fifth hole H5. The fifth hole H5 included in the light shielding portion NDA may be defined by the first print layer 103, the second print layer 105 and the third print layer 107. For example, the first print layer 103, the second print layer 105 and the third print layer 107 may not be disposed in an area corresponding to the fifth hole H5 included in the light shielding portion NDA. Therefore, the fifth hole H5 may be defined due to a step difference between the area and the surrounding light shielding portion NDA.

An infrared print layer 109 may be disposed on the transparent base layer 101 corresponding to the fifth hole H5. The infrared print layer 109 has low transmittance in ultraviolet and visible regions and high transmittance in an infrared region. Accordingly, the infrared sensor disposed to correspond to the fifth hole H5 in the display apparatus 10 can transmit and receive infrared light through the infrared print layer 109.

The protective member FM is disposed on the first print layer 103, the second print layer 105, the third print layer 107 and the infrared print layer 109 of the cover window 100 of the exemplary embodiment. For example, the first adhesive layer CL1 of the first mold part BP1 of the protective member FM and the third adhesive layer CL3 of the second mold part BP2 of the protective member FM may be attached and fixed onto the third print layer 107, and the protective film part FP disposed between the first mold part BP1 and the second mold part BP2 may be disposed above the infrared print layer 109. Since the protective film part FP is connected to the first film layer FL1 of the first mold part BP1 and the second film layer FL2 of the second mold part BP2, it can be placed above the infrared print layer 109 without contacting the infrared print layer 109.

The ground part GP may be disposed on the protective film part FP, and the first mold layer BL1 of the first mold part BP1 and the second mold layer BL2 of the second mold part BP2 may protrude on both sides of the ground part GP. In an exemplary embodiment, a distance W between the ground part GP and the infrared print layer 109 may be 0.25 to 0.35 mm, a thickness d1 of the protective film part FP disposed between the ground part GP and the infrared print layer 109 may be 0.1 mm, a thickness d2 of each of the first mold layer BL1 and the second mold layer BL2 may be 0.7 mm, and a thickness d3 of the second portion P2 of the ground part GP may be 0.1 mm.

The ground part GP may be spaced apart from the protective film part FP. However, the present disclosure is not limited to this case, and a portion of the ground part GP may also contact the protective film part FP. In this case, the protective film part FP may serve as a spacer for maintaining the shape of the ground part GP by supporting the ground part GP. The protective film part FP disposed between the ground part GP and the infrared print layer 109 can prevent or reduce the infrared print layer 109 from being damaged by the ground part GP during assembly and transportation. Further, since the first mold layer BL1 and the second mold layer BL2 disposed on both sides of the ground part GP protrude further than the ground part GP, deformation of the ground part GP due to external force can be prevented or reduced.

Referring to FIG. 6, the cover window 100 of the exemplary embodiment may include the transmissive portion DA in which an image output from the display panel 300 illustrated in FIG. 23 is displayed and the light shielding portion NDA in which an image output from the display panel 300 is not displayed. For example, the transmissive portion DA of the cover window 100 can transmit light as it is because the print layers 103, 105 and 107 are not disposed on the surface of the transparent base layer 101, and the light shielding portion NDA of the cover window 100 can block light because the print layers 103, 105 and 107 are disposed on the surface of the transparent base layer 101.

The light shielding portion NDA of the cover window 100 of the exemplary embodiment may include the speaker hole MH. The speaker hole MH included in the light shielding portion NDA may be defined by the transparent base layer 101, the first print layer 103, the second print layer 105 and the third print layer 107. For example, the speaker hole MH included in the light shielding portion NDA may be defined as an opening area in which the transparent base layer 101, the first print layer 103, the second print layer 105 and the third print layer 107 are not disposed.

In the speaker hole MH of an exemplary embodiment, the mesh structure MM may be disposed. The mesh structure MM may include the first structure MM1 inserted and assembled into the speaker hole MH and the second structure MM2 inserted and assembled into the first structure MM1. The first structure MM1 may include the mesh pattern part DP disposed inside the speaker hole MH and the support part SP disposed around the speaker hole MH. A lower surface of the mesh pattern part DP may be located higher than a lower surface of the transparent base layer 101. In addition, the support part SP may be disposed on the third print layer 107 around the speaker hole MH, and a first adhesive member MC1 may be interposed between the support part SP and the third print layer 107. The support part SP and the third print layer 107 may be attached and fixed to each other by the first adhesive member MC1. However, the present disclosure is not limited to this case, and the first print layer 103, the second print layer 105 and the third print layer 107 may not be disposed around the speaker hole MH, and the support part SP may be attached to the transparent base layer 101 by the first adhesive member MC1.

The connection part CP of the second structure MM2 may include a vertical portion inserted into the mesh pattern part DP of the first structure MM1 and a horizontal portion bent from the vertical portion and disposed on the support part SP of the first structure MM1. A second adhesive member MC2 may be disposed between the horizontal portion of the second structure MM2 and the support part SP of the first structure MM1, and the second structure MM2 and the first structure MM1 may be attached and fixed to each other by the second adhesive member MC2.

In the third portion P3 of the ground part GP, the portion (adjacent to the connection part CP) located lower than the second bending portion BE2 in the second direction (Y-axis direction) may be spaced apart from the connection part CP at a position higher than the connection part CP. However, the present disclosure is not limited to this case, and the portion (adjacent to the connection part CP) of the third portion P3 of the ground part GP which is located lower than the second bending portion BE2 in the second direction (Y-axis direction) may also extend onto the connection part CP and contact an upper surface of the connection part CP.

Referring to FIG. 7, the light shielding portion NDA of the cover window 100 of the exemplary embodiment may include the speaker hole MH, the first hole H1 and the second hole H2 disposed on one side of the speaker hole MH, and the third hole H3 and the fourth hole H4 disposed on the other side of the speaker hole MH. The first through fourth holes H1 through H4 may be defined by the first print layer 103, the second print layer 105 and the third print layer 107. For example, the first print layer 103, the second print layer 105 and the third print layer 107 may not be disposed in areas corresponding to the first through fourth holes H1 through H4 included in the light shielding portion NDA. Thus, the first through fourth holes H1 through H4 may be defined as areas in which the transparent base layer 101 is exposed. However, the present disclosure is not limited to this case, and some of the first print layer 103, the second print layer 105, and the third print layer 107 may also be disposed in the first through fourth holes H1 through H4.

The protective member FM is disposed on the first through fourth holes H1 through H4 of the cover window 100 of the exemplary embodiment. Specifically, the first mold part BP1 of the protective member FM is disposed on the first hole H1 and the second hole H2, and the second mold part BP2 of the protective member FM is disposed on the third hole H3 and the fourth hole H4.

The first mold part BP1 is mounted on the print layers 103, 105 and 107 defining the first hole H1 and the second hole H2, and the first adhesive layer CL1 of the first mold part BP1 is attached and fixed to the third print layer 107. Accordingly, the first mold part BP can prevent or reduce the first hole H1 and the second hole H2 from being damaged. In addition, since the first adhesive layer CL1 of the first mold part BP1 does not adhere to the transparent base layer 101 exposed by the first hole H1 and the second hole H2, the transparent base layer 101 of the first hole H1 and the second hole H2 can be prevented from being contaminated by an adhesive residue.

The second mold part BP2 is mounted on the print layers 103, 105 and 107 defining the third hole H3 and the fourth hole H4, and the third adhesive layer CL3 of the second mold part BP2 is attached and fixed to the third print layer 107. Accordingly, the second mold part BP2 can prevent or reduce the third hole H3 and the fourth hole H4 from being damaged. In addition, since the third adhesive layer CL3 of the second mold part BP2 does not adhere to the transparent base layer 101 exposed by the third hole H3 and the fourth hole H4, the transparent base layer 101 of the third hole H3 and the fourth hole H4 can be prevented from being contaminated by an adhesive residue.

Figure 8:
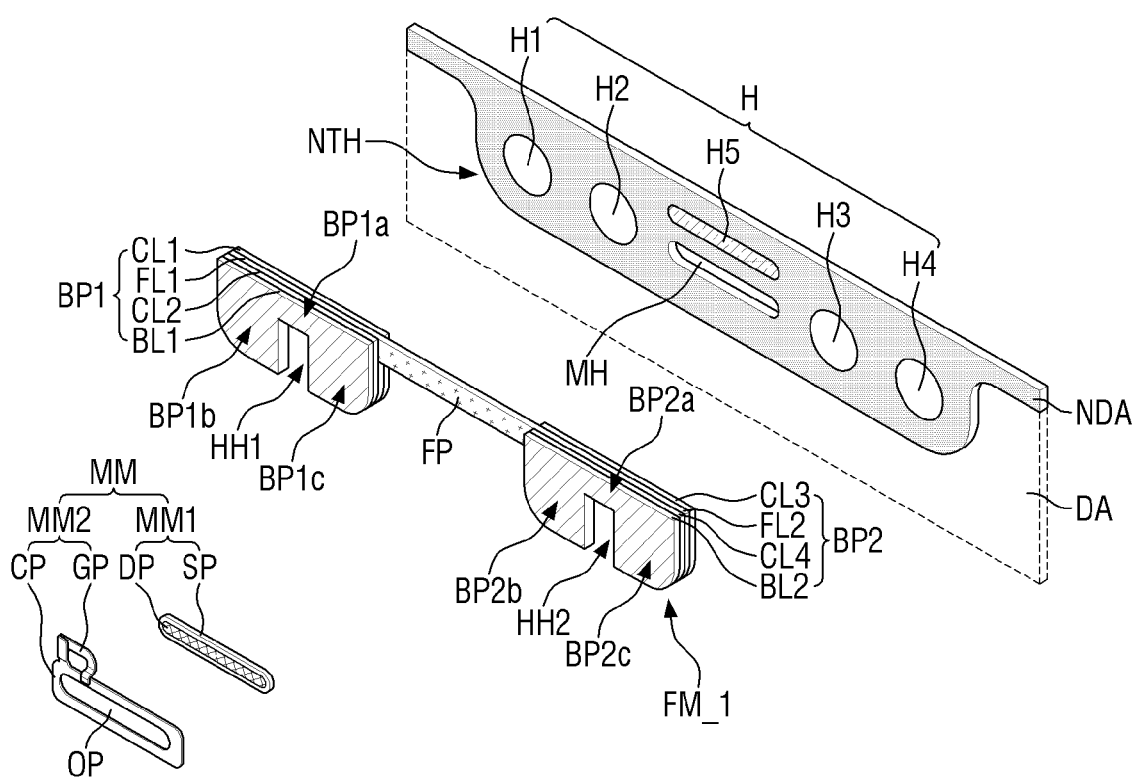
FIG. 8 is an exploded perspective view of a notch portion of a cover window according to an exemplary embodiment.
Figure 9:
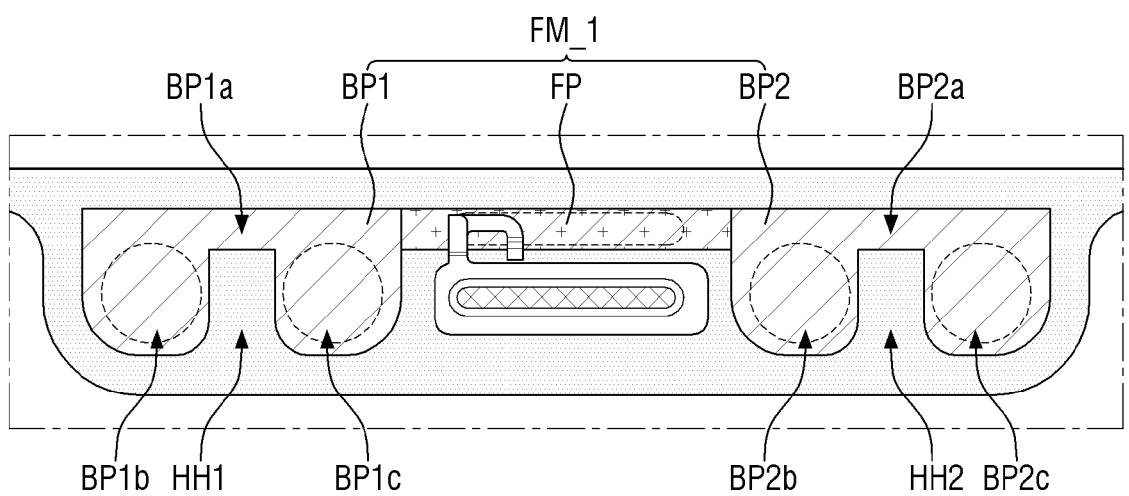
FIG. 9 is an enlarged view of the notch portion of the cover window according to the exemplary embodiment of FIG. 8.

FIG. 8 is an exploded perspective view of a notch portion of a cover window according to an exemplary embodiment, and FIG. 9 is an enlarged view of the notch portion of the cover window according to the exemplary embodiment. The exemplary embodiment of FIGS. 8 and 9 is different from the exemplary embodiment of FIGS. 3, 4A and 4B in that a first open portion HH1 and a second open portion HH2 are provided in a protective member FM_1. For simplicity, a redundant description of elements and features identical to those of FIGS. 3, 4A and 4B will be omitted, and the current exemplary embodiment will now be described, focusing mainly on differences from the exemplary embodiment of FIGS. 3, 4A and 4B.

Referring to FIGS. 8 and 9, a first mold part BP1 and a second mold part BP2 of the protective member FM_1 of an exemplary embodiment may include the open portions HH1 and HH2, respectively. For example, the first mold part BP1 may include the first open portion HH1, and the second mold part BP2 may include the second open portion HH2. A unique serial number marked under the protective member FM_1 may be exposed through the first open portion HH1 and the second open portion HH2.

The first open portion HH1 corresponds to an area between a first hole H1 and a second hole H2 and is formed by removing a portion of the first mold part BP1. The first open portion HH1 may divide the first mold part BP1 into a first body portion BP1*a* disposed above the first open portion HH1 and a first extension portion BP1*b* and a second extension portion BP1*c* extending from the first body portion BP1*a* and disposed on both sides of the first open portion HH1. The first body portion BP1*a* may be mounted above the first hole H1 and the second hole H2, the first extension portion BP1*b* may be mounted on the first hole H1, and the second extension portion BP1*c* may be mounted on the second hole H2. The first open portion HH1 may expose the area between the first hole H1 and the second hole H2. The width of the first body portion BP1*a* may be equal to the width of the protective film part FP. However, the present disclosure is not limited to this case, and the width of the first body portion BP1*a* may also be different from the width of the protective film part FP depending on the sizes and positions of the first hole H1 and the second hole H2.

The first open portion HH1 of an exemplary embodiment may have a bar shape with one side open. However, the first open portion HH1 may also have, e.g., a shape without an open side or may have various shapes such as a dot shape, a circular shape and an elliptical shape.

The second open portion HH2 corresponds to an area between a third hole H3 and a fourth hole H4 and is formed by removing a portion of the second mold part BP2. The second open portion HH2 may divide the second mold part BP2 into a second body portion BP2*a* disposed above the second open portion HH2 and a third extension portion BP2*b* and a fourth extension portion BP2*c* extending from the second body portion BP2*a* and disposed on both sides of the second open portion HH2. The second body portion BP2*a* may be mounted above the third hole H3 and the fourth hole H4, the third extension portion BP2*b* may be mounted on the third hole H3, and the fourth extension portion BP2*c* may be mounted on the fourth hole H4. The second open portion HH2 may expose the area between the third hole H3 and the fourth hole H4.

Since the protective member FM_1 of the exemplary embodiment exposes a unique serial number through the first open portion HH1 and the second open portion HH2 as described above, the serial number can be read in a state where the protective member FM_1 is attached.

Figure 10:
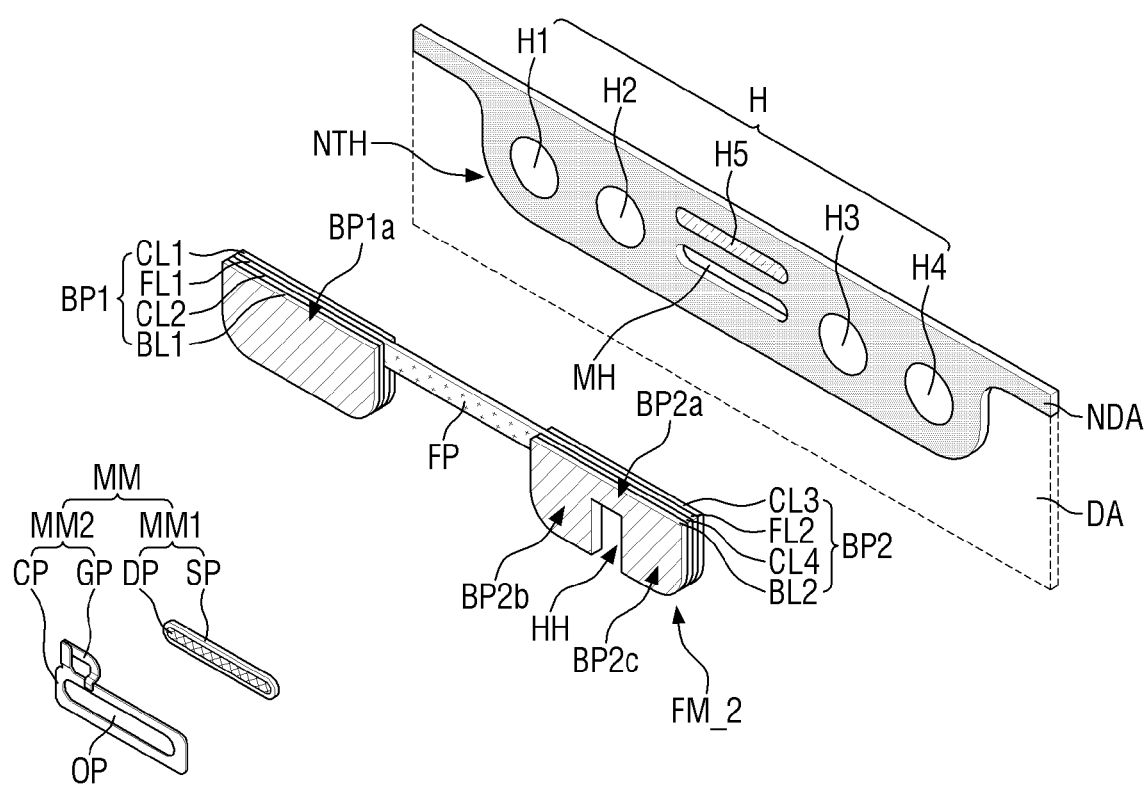
FIG. 10 is an exploded perspective view of a notch portion of a cover window according to an exemplary embodiment.
Figure 11:
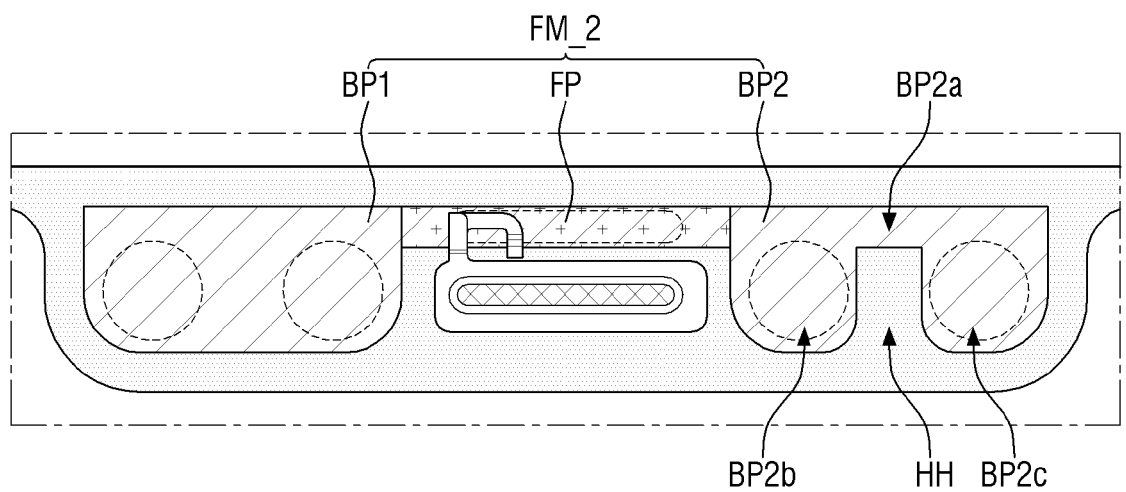
FIG. 11 is an enlarged view of the notch portion of the cover window according to the exemplary embodiment of FIG. 10.

FIG. 10 is an exploded perspective view of a notch portion of a cover window according to an exemplary embodiment, and FIG. 11 is an enlarged view of the notch portion of the cover window according to the exemplary embodiment. The exemplary embodiment of FIGS. 10 and 11 is different from the exemplary embodiment of FIGS. 8 and 9 in that an open portion HH is provided only in a second mold part BP2 of a protective member FM_2. For simplicity, a redundant description of elements and features identical to those of FIGS. 8 and 9 will be omitted, and the current exemplary embodiment will now be described, focusing mainly on differences from the exemplary embodiment of FIGS. 8 and 9.

Referring to FIGS. 10 and 11, the open portion HH may be disposed in the second mold part BP2 of the protective member FM_2 of the exemplary embodiment. However, the open portion HH may also be disposed only in a first mold part BP1.

The open portion HH corresponds to an area between a third hole H3 and a fourth hole H4 and is formed by removing a portion of the second mold part BP2. The open portion HH may divide the second mold part BP2 into a body portion BP2*a* disposed above the open portion HH and a first extension portion BP2*b* and a second extension portion BP2*c* extending from the body portion BP2*a* and disposed on both sides of the open portion HH. The body portion BP2*a* may be mounted above the third hole H3 and the fourth hole H4, the first extension portion BP2*b* may be mounted on the third hole H3, and the second extension portion BP2*c* may be mounted on the fourth hole H4. The open portion HH may expose the area between the third hole H3 and the fourth hole H4.

As described above, the open portion HH for exposing a unique serial number or the like is disposed in any one of the first mold part BP1 and the second mold part BP1 of the protective member FM_2 of the exemplary embodiment. However, the present disclosure is not limited to this case, and the open portion HH may also be disposed in a protective film part FP depending on the position of the unique serial number.

Figure 12:
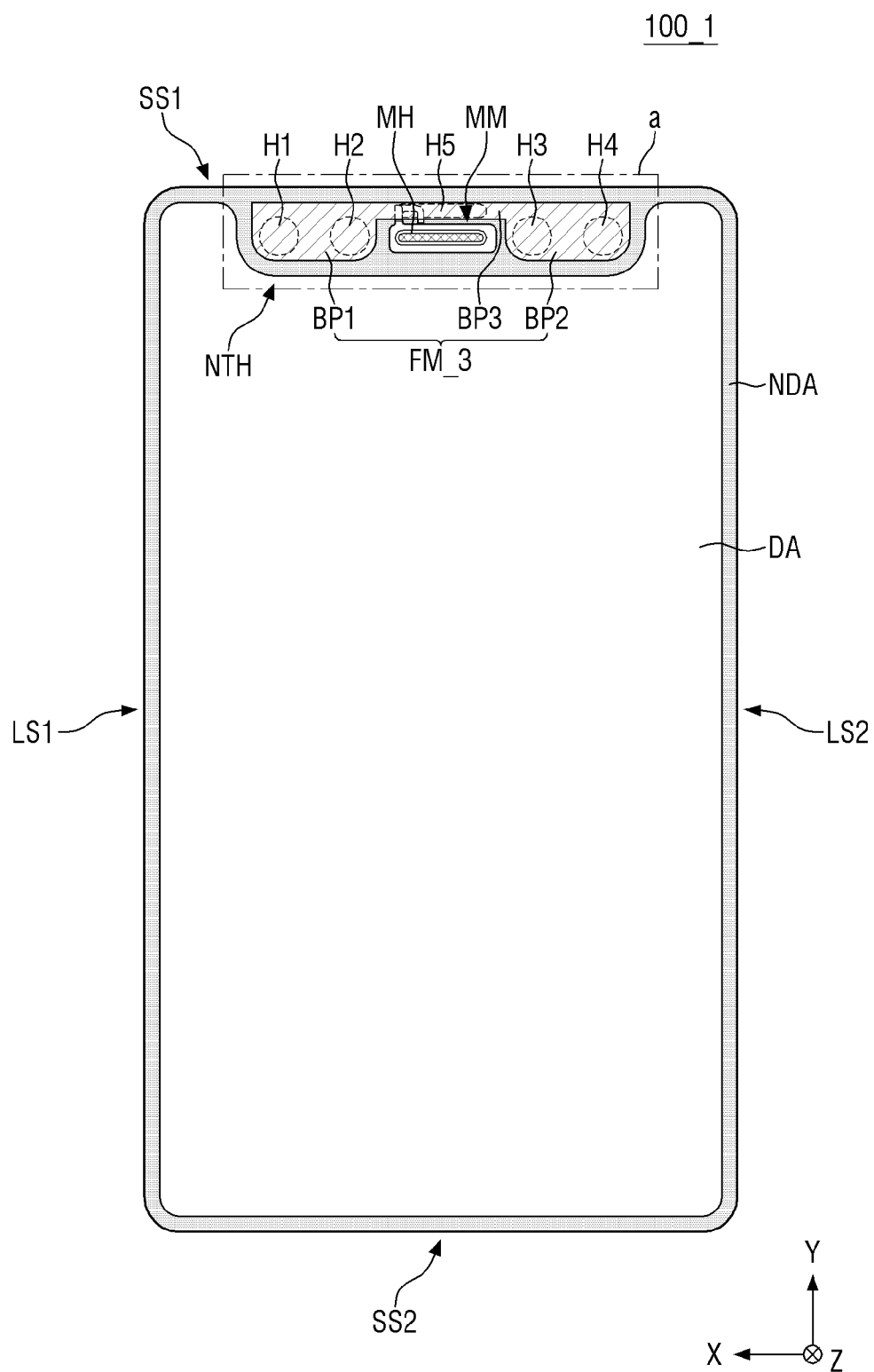
FIG. 12 is a schematic bottom view of a cover window according to an exemplary embodiment.
Figure 13:
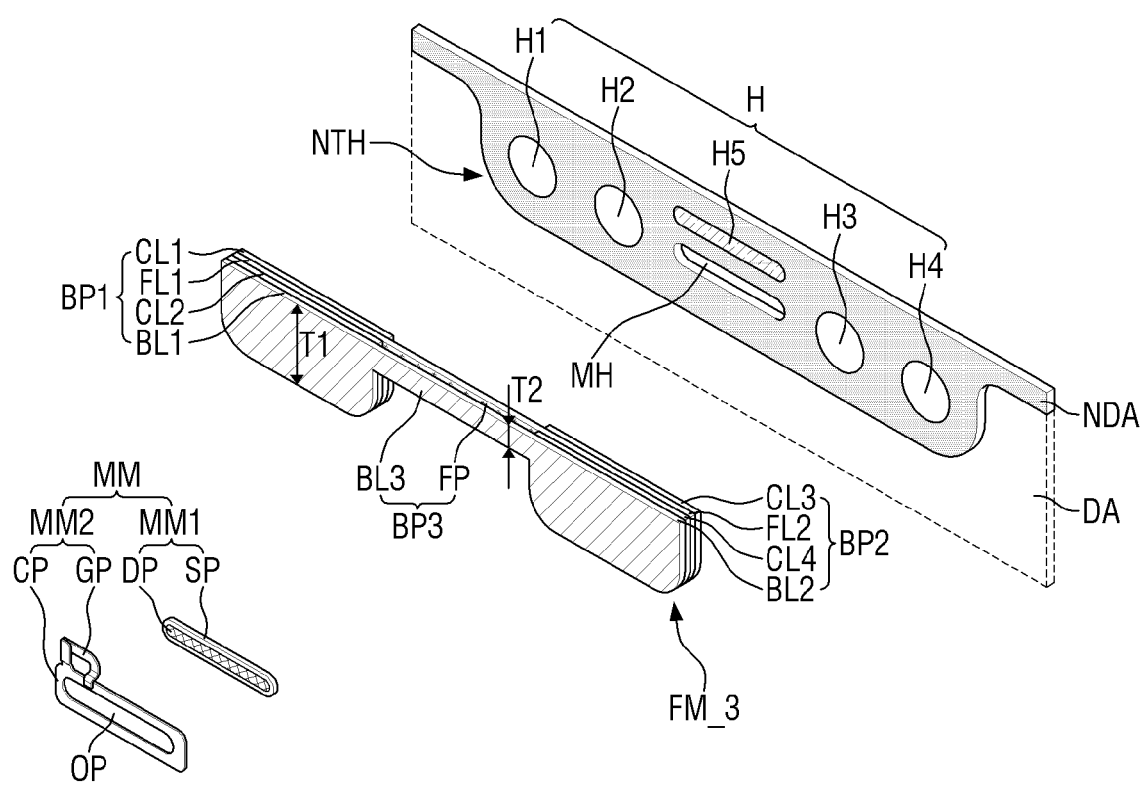
FIG. 13 is an exploded perspective view of a notch portion of the cover window according to the exemplary embodiment of FIG. 12.
Figure 14:
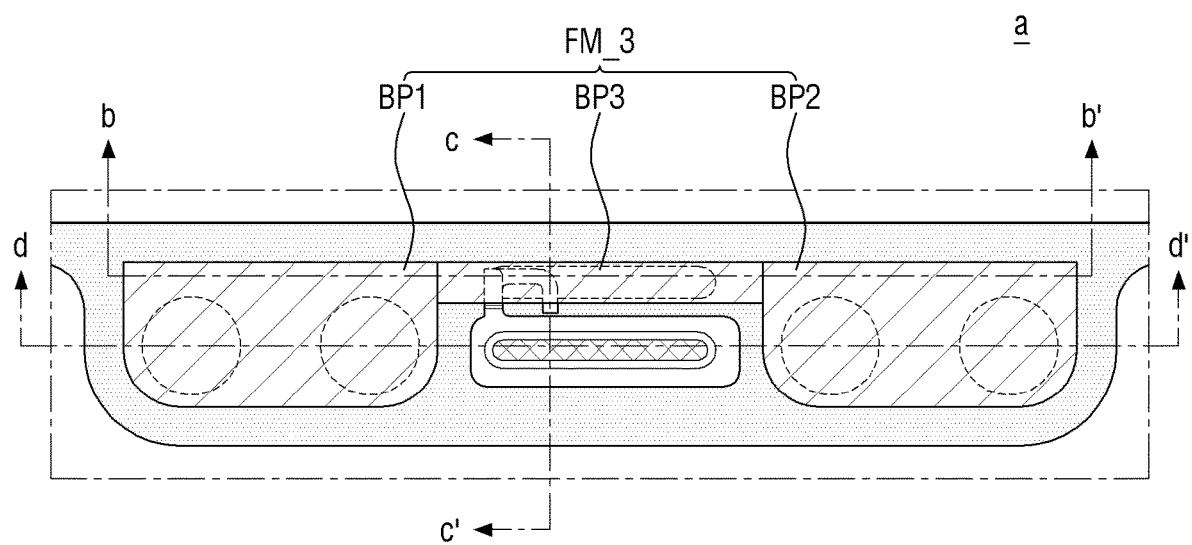
FIG. 14 is an enlarged view of a portion 'a' of the cover window according to the exemplary embodiment of FIG. 12.

FIG. 12 is a schematic bottom view of a cover window 100_1 according to an exemplary embodiment, FIG. 13 is an exploded perspective view of a notch portion of the cover window 100_1 according to the exemplary embodiment, and FIG. 14 is an enlarged view of a portion 'a' of the cover window 100_1 according to the exemplary embodiment. The exemplary embodiment of FIGS. 12, 13 and 14 is different from the exemplary embodiment of FIGS. 2, 3 and 4A in that a third mold layer BL3 is added to a protective member FM_3. For simplicity, a redundant description of elements and features identical to those of FIGS. 2, 3 and 4A will be omitted, and the current exemplary embodiment will now be described, focusing mainly on differences from the exemplary embodiment of FIGS. 2, 3 and 4A.

Referring to FIGS. 12 through 14, the protective member FM_3 of the cover window 100_1 of the exemplary embodiment may include a first mold part BP1, a second mold part BP2, and a third mold part BP3 disposed between the first mold part BP1 and the second mold part BP2. The first mold part BP1 is disposed on a first hole H1 and a second hole H2, the second mold part BP2 is disposed on a third hole H3 and a fourth hole H4, and the third mold part BP3 is disposed on a fifth hole H5.

The third mold part BP3 may include a protective film part FP and the third mold layer BL3, and the protective film part FP and the third mold layer BL3 may be spaced apart from each other.

The protective film part FP may be integrally connected to each of a first film layer FL1 of the first mold part BP1 and a second film layer FL2 of the second mold part BP2. For example, the protective film part FP may have a width smaller than the width of each of the first film layer FL1 and the second film layer FL2 and connect the first film layer FL1 and the second film layer FL2. Alternatively, the protective film part FP may be connected to any one of the first film layer FL1 and the second film layer FL2.

The third mold layer BL3 may be connected to each of a first mold layer BL1 of the first mold part BP1 and a second mold layer BL2 of the second mold part BP2. For example, the third mold layer BL3 may have a width T2 smaller than a width T1 of each of the first mold layer BL1 and the second mold layer BL2 and connect a portion of the first mold layer BL1 and a portion of the second mold layers BL2. Alternatively, the third mold layer BL3 may be connected to any one of the first mold layer BL1 and the second mold layer BL2.

The width T2 of the third mold layer BL3 may be equal to the width of the protective film part FP. However, the present disclosure is not limited to this case, and the width T2 of the third mold layer BL3 may also be different from the width of the protective film part FP.

Figure 15:
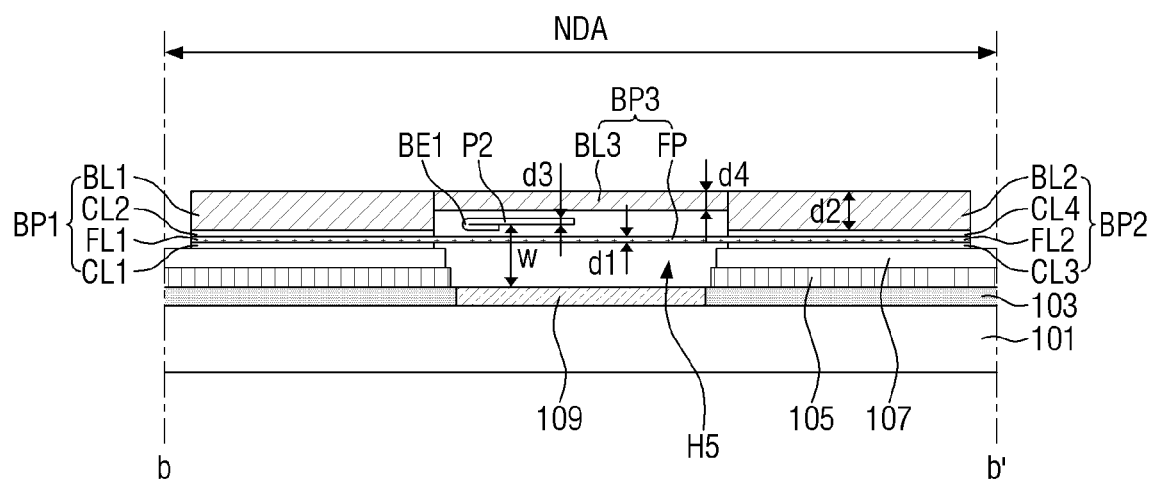
FIG. 15 is a cross-sectional view taken along line b-b' of FIG. 14.
Figure 16:
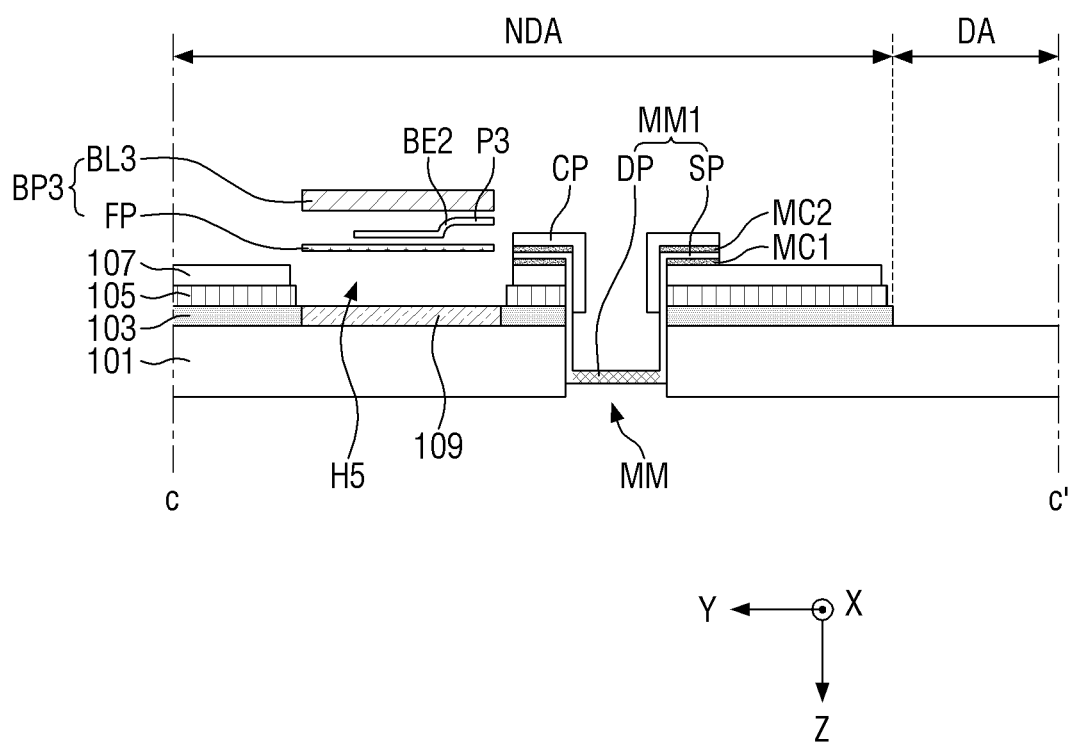
FIG. 16 is a cross-sectional view taken along line c-c' of FIG. 14.
Figure 17:
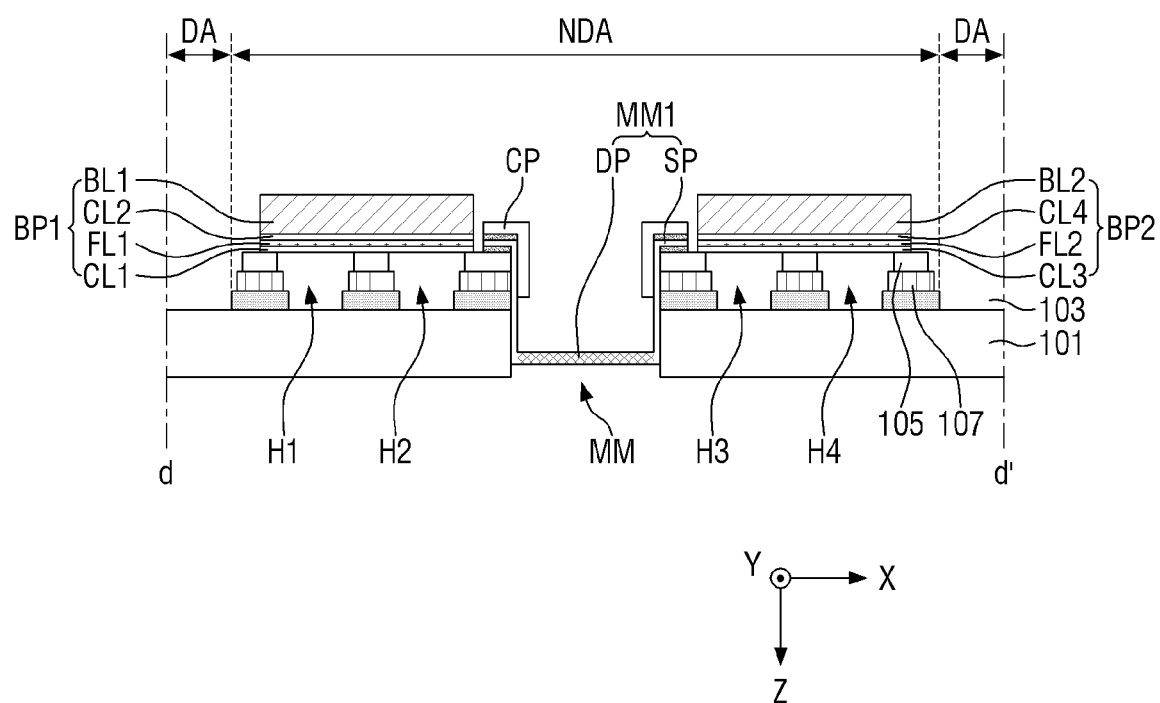
FIG. 17 is a cross-sectional view taken along line d-d' of FIG. 14.

FIG. 15 is a cross-sectional view taken along line b-b' of FIG. 14, FIG. 16 is a cross-sectional view taken along line c-c' of FIG. 14, and FIG. 17 is a cross-sectional view taken along line d-d' of FIG. 14.

Referring to FIGS. 15 through 17, the protective member FM_3 is disposed on a first print layer 103, a second print layer 105, a third print layer 107 and an infrared print layer 109 of the cover window 100_1 of the exemplary embodiment. For example, a first adhesive layer CL1 of the first mold part BP1 of the protective member FM_3 and a third adhesive layer CL3 of the second mold part BP2 of the protective member FM_3 may be attached and fixed onto the third print layer 107, the third mold part BP3 disposed between the first mold part BP1 and the second mold part BP2 may be disposed above the infrared print layer 109, and the third mold part BP3 and the infrared print layer 109 may be separated from each other by a certain distance.

The protective film part FP and the third mold layer BL3 of the third mold part BP3 may be spaced apart from each other in the third direction (Z-axis direction), and a ground part GP of a mesh structure MM may be disposed in a space between the protective film part FP and the third mold layer BL3. That is, the protective film part FP may be disposed above the infrared print layer 109 of the fifth hole H5, the ground part GP may be disposed above the protective film part FP, and the third mold layer BL3 may be disposed above the ground part GP. In addition, for the space between the third mold layer BL3 and the protective film part FP, a thickness d4 of the third mold layer BL3 may be made smaller than a thickness d2 of each of the first mold layer BL1 and the second mold layer BL2. In addition, upper surfaces of the first mold layer BL1, the second mold layer BL2 and the third mold layer BL3 may be aligned to be flat. However, the present disclosure is not limited to this case, and the upper surfaces of the first mold layer BL1, the second mold layer BL2 and the third mold layer BL3 may also have a step difference.

The protective member FM_3 can prevent or reduce the fifth hole H5 from being damaged by the ground part GP during assembly or transportation by using the protective film part FP of the third mold part BP3 and prevent or reduce the ground part GP from being deformed by an external force by using the third mold layer BL3 of the third mold part BP3.

Figure 18:
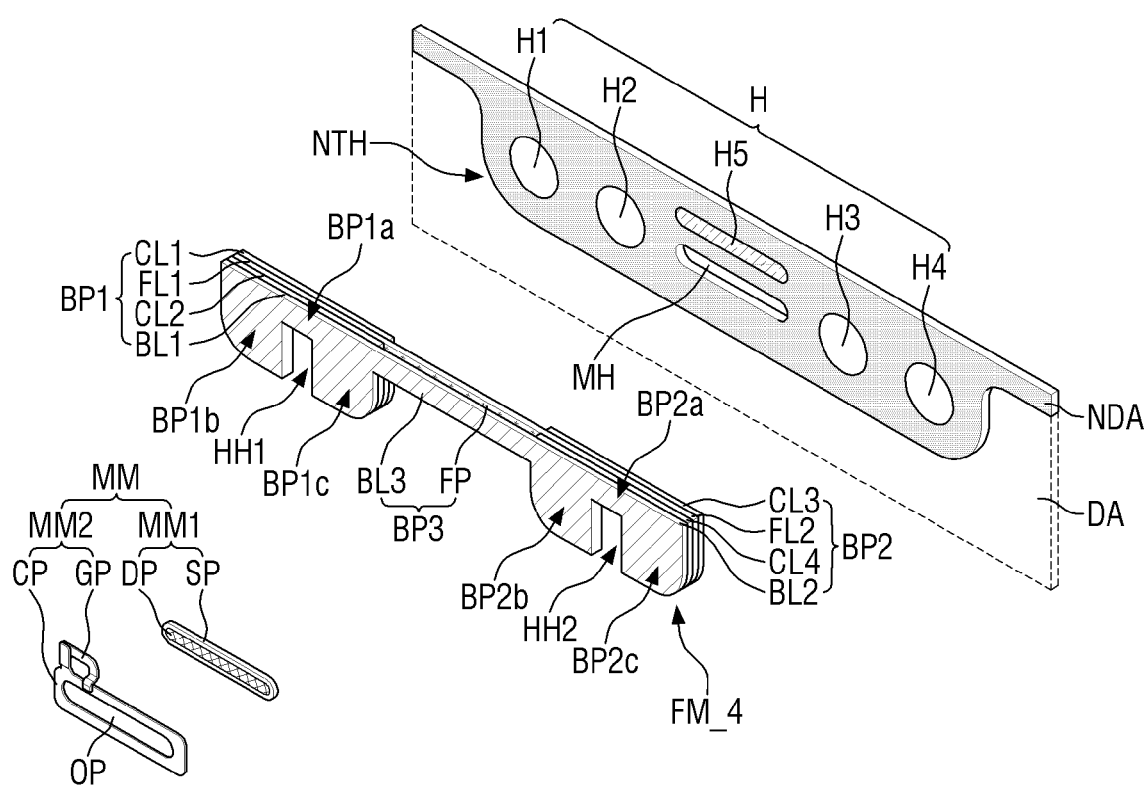
FIG. 18 is an exploded perspective view of a notch portion of a cover window according to an exemplary embodiment.
Figure 19:
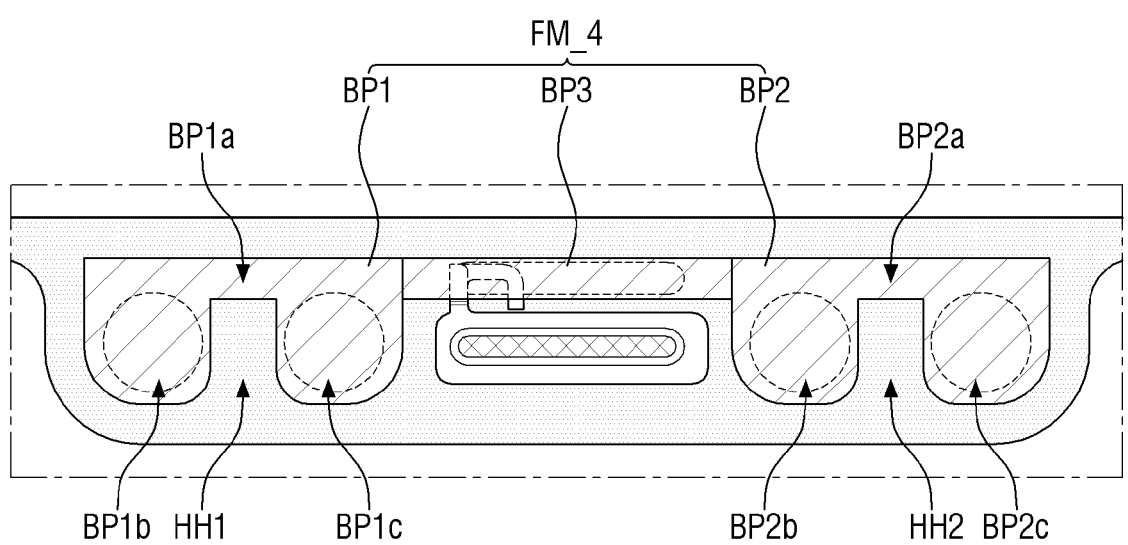
FIG. 19 is an enlarged view of the notch portion of the cover window according to the exemplary embodiment of FIG. 18.
Figure 20:
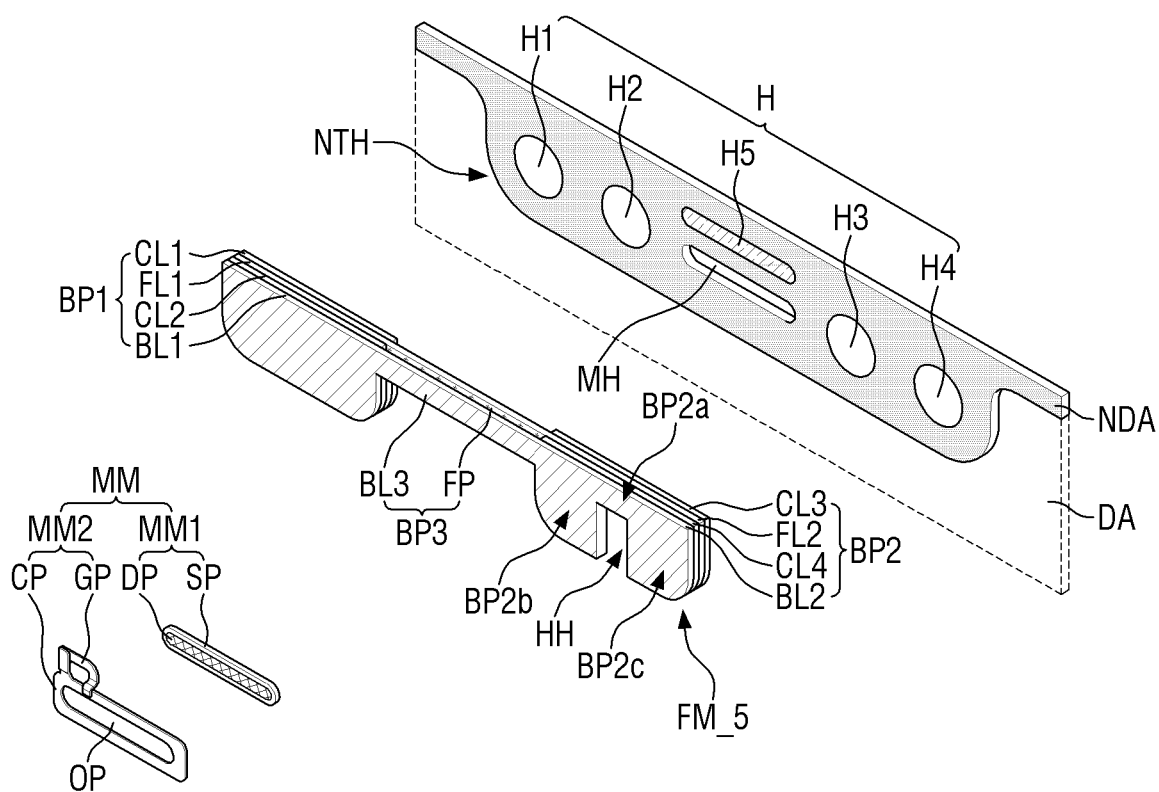
FIG. 20 is an exploded perspective view of a notch portion of a cover window according to an exemplary embodiment.
Figure 21:
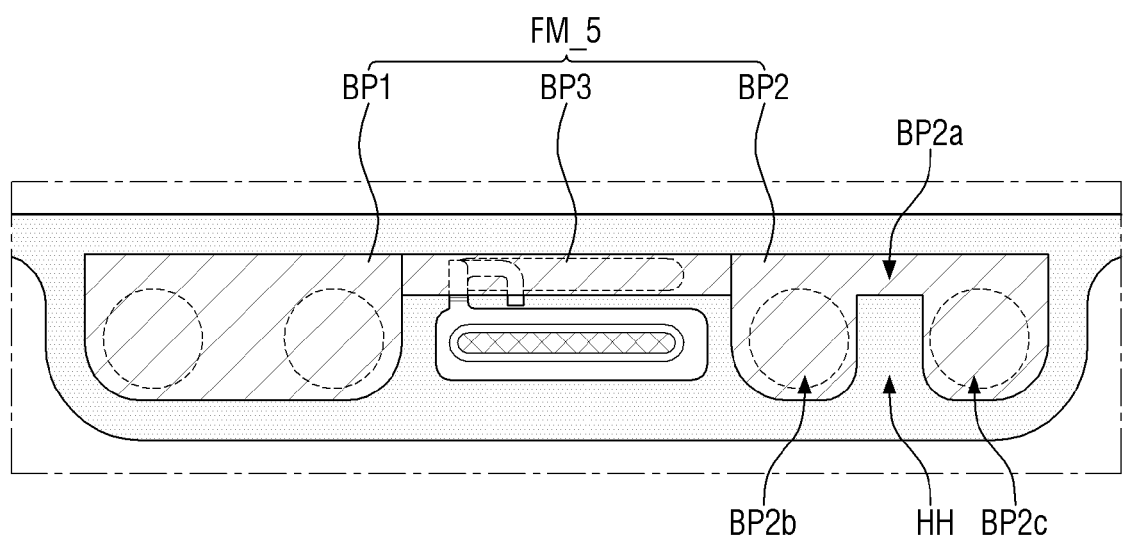
FIG. 21 is an enlarged view of the notch portion of the cover window according to the exemplary embodiment of FIG. 20.

FIG. 18 is an exploded perspective view of a notch portion of a cover window according to an exemplary embodiment, and FIG. 19 is an enlarged view of the notch portion of the cover window according to the exemplary embodiment. FIG. 20 is an exploded perspective view of a notch portion of a cover window according to an exemplary embodiment, and FIG. 21 is an enlarged view of the notch portion of the cover window according to the exemplary embodiment. The exemplary embodiments of FIGS. 18 through 21 are different from the exemplary embodiment of FIGS. 13 and 14 in that one or more open portions are provided in a protective member. For simplicity, a redundant description of elements and features identical to those of FIGS. 13 and 14 will be omitted, and the current exemplary embodiments will now be described, focusing mainly on differences from the exemplary embodiment of FIGS. 13 and 14

Referring to FIGS. 18 and 19, a first mold part BP1 and a second mold part BP2 of a protective member FM_4 of an exemplary embodiment may include open portions HH1 and HH2, respectively. For example, the first mold part BP1 may include a first open portion HH1, and the second mold part BP2 may include a second open portion HH2. Referring to FIGS. 20 and 21, an open portion HH may be disposed in a second mold part BP2 of a protective member FM_5 of an exemplary embodiment. However, the present disclosure is not limited to this case, and an open portion may also be disposed in a third mold part BP3.

As described above, one or more open portions HH for exposing a unique serial number or the like can be provided in each of the protective members FM_4 and FM_5 of the exemplary embodiments, and the serial number can be read through the open portions HH in a state where the protective member FM_4 or FM_5 is attached.

FIG. 22 is an exploded perspective view of a display apparatus 10 including a cover window 100 according to an exemplary embodiment, and FIG. 23 is a cross-sectional view of the display apparatus 10 including the cover window 100 according to the exemplary embodiment.

Referring to FIGS. 22 and 23, the display apparatus 10 according to the exemplary embodiment includes the cover window 100, a touch sensing device 200, a display panel 300, a middle frame 600, and a lower cover 900.

The cover window 100 may be any one of the cover windows described above with reference to FIGS. 1 through 21. A protective member FM is removed in the process of assembling the cover window 100 to the touch sensing device 200, the display panel 300, the middle frame 600 and the lower cover 900.

The touch sensing device 200 may be disposed between the cover window 100 and the display panel 300. The touch sensing device 200 may be disposed to correspond to a transmissive portion DA of the cover window 100. However, the present disclosure is not limited to this case, and the touch sensing device 200 may also be disposed in the transmissive portion DA and a part of a light shielding portion NDA of the cover window 100. In this case, a touch can also be sensed in the light shielding portion NDA.

The touch sensing device 200 may be attached to a lower surface of the cover window 100 by a first adhesive layer 910. A polarizing film may be additionally disposed on the touch sensing device 200 in order to prevent or reduce a decrease in visibility due to reflection of external light. In this case, the polarizing film may be attached to the lower surface of the cover window 100 by the first adhesive layer 910.

The touch sensing device 200 is a device for sensing a user's touch position and may be implemented as a capacitance type such as a self-capacitance type or a mutual capacitance type. The touch sensing device 200 may include only touch driving electrodes when implemented as a capacitance type and may include touch driving electrodes and touch sensing electrodes when implemented as a mutual capacitance type. The touch sensing device 200 implemented as a mutual capacitance type will be mainly described below.

The touch sensing device 200 may be formed in the form of a panel or a film. In this case, the touch sensing device 200 may be attached onto a thin-film encapsulation layer of the display panel 300 by a second adhesive layer 920. The second adhesive layer 920 may be an optically clear adhesive film (OCA) or an optically clear resin (OCR).

Alternatively, the touch sensing device 200 may be formed integrally with the display panel 300. In this case, the touch driving electrodes and the touch sensing electrodes of the touch sensing device 200 may be formed on the thin-film encapsulation layer of the display panel 300.

The display panel 300 may be disposed below the touch sensing device 200. The display panel 300 may be overlapped by the transmissive portion DA of the cover window 100. The display panel 300 may be a light emitting display panel including light emitting elements. For example, the display panel 300 may be an organic light emitting display panel using organic light emitting diodes, a micro light emitting diode display panel using micro light emitting diodes, or a quantum dot light emitting display panel including quantum dot light emitting diodes.

The display panel 300 may include a substrate, a thin-film transistor layer disposed on the substrate, a light emitting element layer, and the thin-film encapsulation layer.

Since the display panel 300 is implemented as being flexible, it may be made of plastic. In this case, the substrate may include a flexible substrate and a support substrate. The support substrate for supporting the flexible substrate may have less flexibility than the flexible substrate. Each of the flexible substrate and the support substrate may include a polymer material having flexibility. For example, each of the flexible substrate and the support substrate may be polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination of these materials.

The thin-film transistor layer is disposed on the substrate. The thin-film transistor layer may include scan lines, data lines, and thin-film transistors. Each of the thin-film transistors includes a gate electrode, a semiconductor layer, and source and drain electrodes. When a scan driving unit is formed directly on the substrate, it may be formed together with the thin-film transistor layer.

The light emitting element layer is disposed on the thin-film transistor layer. The light emitting element layer includes anodes, a light emitting layer, a cathode, and banks. The light emitting layer may include an organic light emitting layer containing an organic material. For example, the light emitting layer may include a hole injection layer, a hole transporting layer, an organic light emitting layer, an electron transporting layer, and an electron injection layer. The hole injection layer and the electron injection layer can be omitted. When a voltage is applied to the anodes and the cathode, holes and electrons move to the organic light emitting layer through the hole transporting layer and the electron transporting layer, respectively, and combine together in the organic light emitting layer, thereby emitting light. The light emitting element layer may be a pixel array layer in which pixels are formed. Thus, an area in which the light emitting element layer is formed may be defined as a display area for displaying an image. An area around the display area may be defined as a non-display area.

The thin-film encapsulation layer is disposed on the light emitting element layer. The thin-film encapsulation layer prevents or reduces penetration of oxygen or moisture into the light emitting element layer. The thin-film encapsulation layer may include at least one inorganic layer and at least one organic layer.

The middle frame 600 may be disposed below the display panel 300. The bottom of the display panel 300 may be attached to the middle frame 600 by a third adhesive layer 930. The middle frame 600 may include a bottom portion 600a and a side portion 600b extending from ends of the bottom portion 600a. In an exemplary embodiment, the display panel 300 and a speaker 400 may be accommodated on the bottom portion 600a. The speaker 400 may be accommodated on the bottom portion 600a of the middle frame 600 such that it corresponds to a speaker hole MH of the cover window 100, and the display panel 300 may be accommodated on the bottom portion 600a of the middle frame 600 such that it corresponds to the transmissive portion DA of the cover window 100.

The speaker 400 is not limited to a particular type, and a known speaker can be used. For example, a known speaker modularized for application to a portable terminal may be used.

In an exemplary embodiment, a mesh structure MM may be disposed in the speaker hole MH. The mesh structure MM may include a first structure MM1 inserted and assembled into the speaker hole MH and a second structure MM2 inserted and assembled into the first structure MM1.

The first structure MM1 may include a mesh pattern part DP disposed inside the speaker hole MH and a support part SP disposed around the speaker hole MH.

The mesh pattern part DP may be shaped like a cylinder with one surface having a mesh pattern and the other surface open. However, the present disclosure is not limited to this case, and the mesh pattern part DP may also have various shapes corresponding to the speaker hole MH. The mesh pattern part DP may be inserted into the speaker hole MH and may emit sound produced by the speaker 400 to the outside of the display apparatus 10.

The support part SP may be formed by bending edges of the other surface of the mesh pattern part DP. The support part SP is disposed around the speaker hole MH to prevent or reduce the mesh pattern part DP from passing through the speaker hole MH.

The second structure MM2 may include a connection part CP assembled to the first structure MM1 and the ground part GP protruding from the connection part CP onto a fifth hole H5.

In the display apparatus 10 of the exemplary embodiment, the ground part GP of the mesh structure MM disposed in the speaker hole MH may contact the middle frame 600. For example, the ground part GP of the mesh structure MM may contact the side portion 600b of the middle frame 600. However, the ground part GP of the mesh structure MM may also contact the bottom portion 600a of the middle frame 600. Since the ground part GP of the mesh structure MM contacts the middle frame 600, the static electricity introduced through the speaker hole MH of the cover window 100 from the outside can be discharged through the middle frame 600, thereby preventing or reducing damage to components such as the touch sensing device 200 and the display panel 300.

The lower cover 900 may be disposed below the middle 600. The lower cover 900 may be fastened and fixed to the middle frame 600. The lever cover 900 may form the bottom exterior of the display apparatus 10. The lower cover 900 may include plastic and/or metal.

A cover window according to an exemplary embodiment includes a protective member to prevent or reduce deformation of a ground part in an assembly process.

A display apparatus having a cover window according to an exemplary embodiment can improve its reliability by preventing or reducing static electricity introduced from the outside from flowing into a display panel.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A cover window comprising:
   a transparent base layer comprising a speaker opening;
   a first print layer disposed on a surface of the transparent base layer;
   a protective member disposed on the first print layer; and
   a mesh structure comprising a mesh pattern and a ground part connected to the mesh pattern,
   wherein the mesh pattern of the mesh structure is inserted into the speaker opening, the ground part of the mesh structure is disposed outside the speaker opening, and the protective member comprises a protective film part disposed between the first print layer and the ground part.

2. The cover window of claim 1, wherein the protective member further comprises a first mold part connected to a first end of the protective film part, and the first mold part protrudes further than the ground part.

3. The cover window of claim 2, further comprising a first opening disposed on the transparent base layer, wherein the first mold part is disposed on the first opening.

4. The cover window of claim 3, further comprising a second print layer disposed on the transparent base layer and defining the first opening, wherein the first mold part contacts the second print layer.

5. The cover window of claim 4, wherein the protective member further comprises a second mold part connected to a second end of the protective film part, and the second mold part protrudes further than the ground part.

6. The cover window of claim 5, further comprising a second opening disposed on the transparent base layer, wherein the second mold part is disposed on the second opening.

7. The cover window of claim 6, further comprising a third print layer disposed on the transparent base layer and defining the second opening, wherein the second mold part contacts the third print layer.

8. The cover window of claim 7, wherein the first print layer is thinner than the second print layer and the third print layer.

9. The cover window of claim 8, wherein each of the second print layer and the third print layer is comprised of a plurality of layers, and the first print layer is an infrared print layer.

10. The cover window of claim 9, wherein the first mold part comprises a first film layer and a first mold layer, and the second mold part comprises a second film layer and a second mold layer, and wherein the first film layer and the second film layer are connected by the protective film part.

11. The cover window of claim 10, further comprising a third mold layer disposed on the ground part, wherein the first mold layer and the second mold layer are connected by the third mold layer.

12. The cover window of claim 11, wherein each of the first mold layer and the second mold layer has a first thickness, and the third mold layer has a second thickness smaller than the first thickness.

13. The cover window of claim 11, wherein each of the first mold layer and the second mold layer has a first width, and the third mold layer has a second width smaller than the first width.

14. The cover window of claim 13, wherein the protective film part has a same width as the first width.

15. The cover window of claim 2, wherein the first mold part comprises a body portion and first and second extension portions extending from the body portion, and the first extension portion and the second extension portion are spaced apart from each other.

16. The cover window of claim 15, further comprising a first opening and a second opening disposed on the transparent base layer, wherein the first extension portion is disposed on the first opening, and the second extension portion is disposed on the second opening.

17. The cover window of claim 1, wherein the mesh structure comprises a first structure inserted into the speaker opening and comprising the mesh pattern and a second structure disposed on the first structure and comprising the ground part.

18. A display apparatus comprising:
    a cover window comprising a speaker opening;
    a display panel disposed below the cover window; and
    a middle frame disposed below the display panel,
    wherein a mesh structure comprising a mesh pattern and a ground part connected to the mesh pattern is disposed in the speaker opening, and the ground part contacts the middle frame.

19. The display apparatus of claim 18, wherein the mesh pattern of the mesh structure is inserted into the speaker opening, and the ground part of the mesh structure is disposed outside the speaker opening.

20. The display apparatus of claim 19, wherein the middle frame comprises a bottom portion and a side portion extending from ends of the bottom portion, and the ground part contacts the side portion.

* * * * *